United States Patent

Baumann et al.

[11] 4,163,097
[45] Jul. 31, 1979

[54] CROSSLINKABLE POLYMERIC COMPOUNDS

[75] Inventors: Niklaus Baumann, Marly; Hans Zweifel; Marcus Bauman, both of Basel, all of Switzerland; John S. Waterhouse, Cherry Hinton, England

[73] Assignee: Ciba-Geigy Corporation, Ardsley, N.Y.

[21] Appl. No.: 865,063

[22] Filed: Dec. 27, 1977

Related U.S. Application Data

[62] Division of Ser. No. 695,347, Jun. 14, 1976, Pat. No. 4,079,041.

[30] Foreign Application Priority Data

Jun. 18, 1975 [CH] Switzerland ............... 7957/75
Nov. 27, 1975 [CH] Switzerland ............. 15391/75

[51] Int. Cl.² ............................................. C08G 59/02
[52] U.S. Cl. ......................................... 525/531; 260/9; 260/17.4 R; 260/112 R; 260/117; 526/259; 526/262; 528/117; 528/422; 528/87; 528/322; 525/531; 525/444; 525/449; 525/451; 525/417; 525/59; 525/282; 525/502; 525/98; 525/104; 525/114; 525/228
[58] Field of Search ...................... 526/259, 263; 260/63 UY; 528/87, 117

[56] References Cited

U.S. PATENT DOCUMENTS

| | | | |
|---|---|---|---|
| 2,484,423 | 10/1949 | Reynolds et al. | 526/259 |
| 3,652,716 | 3/1972 | Holub et al. | 260/860 |
| 3,729,446 | 4/1973 | Holub et al. | 260/47 CZ |
| 3,763,271 | 10/1973 | Klobe et al. | 260/78 UA |
| 3,773,718 | 11/1973 | Klobe et al. | 260/47 ET |
| 3,887,582 | 6/1975 | Holub et al. | 526/259 |

FOREIGN PATENT DOCUMENTS

49-128991 10/1974 Japan .
49-128992 10/1974 Japan .
50-5377 1/1975 Japan .
50-5379 5/1975 Japan .

OTHER PUBLICATIONS

M. Kato et al., Polymer Letters, 8 263 (1970).
N. J. Turro, Molecular Photochemistry, W. A. Benjamin (1965) p. 107.

*Primary Examiner*—Harry Wong, Jr.
*Attorney, Agent, or Firm*—Luther A. R. Hall

[57] ABSTRACT

The invention relates to organic polymers which can be crosslinked under the action of light and which are suitable for carrying out photomechanical processes. These polymers are photochemically considerably more sensitive than known comparable polymers and their sensitivity can additionally also be further increased by means of a combination with sensitizers. The molecular weight is at least 1,000. The polymers contain, as light-sensitive groups, groups of the formula I

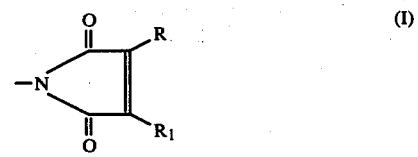

wherein R and $R_1$ independently of one another denote alkyl groups with at most 4 C atoms, or R and $R_1$ conjointly denote the remaining part of a 5-membered to 6-membered carbocyclic ring.

6 Claims, No Drawings

CROSSLINKABLE POLYMERIC COMPOUNDS

This is a Divisional of application Ser. No. 695,347, filed on June 14, 1976, now U.S. Pat. No. 4,079,041, issued on Mar. 14, 1978.

The invention relates to new organic polymers which can be crosslinked under the action of electromagnetic waves. Since, in respect of their physical and chemical properties, the constituents, of the polymers, which are crosslinked under the action of electromagnetic radiation do not differ substantially from the constituents, of the polymers, which are not affected by the radiation, photomechanical processes can be carried out using the new polymers.

A number of polymers which can be crosslinked under the action of light are already known. In most of these light-sensitive polymers, the photo-active groups are linked as side substituents to the polymer chain. In this connection there may be mentioned, in particular, the following Japanese Published Specification: JA 49-128,991, JA 49-128,992, JA 49-128,993, JA 50-5,376, JA 50-5,377, JA 50-5,378, JA 50-5,379 and JA 50-5,380.

In these Japanese patent applications, processes for the manufacture of light-sensitive polymers are claimed and these polymers contain, as light-sensitive groups, groups of the formula II

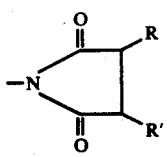
(II)

in which R denotes an aromatic radical and R' denotes H, halogen, alkyl or -CN.

However, known polymers of this type have the disadvantage that their photochemical sensitivity is much too low for particular phototechnical applications. This characteristic has an adverse effect in particular in that, ultimately, images or relief images which are not sharp result when corresponding photomechanical processes are carried out and that the exposure times required are too long.

In the case of these polymers it is also not possible to eliminate this disadvantage by using sensitisers for photochemical reactions. Apparently this is because the development of the action of these sensitisers is very greatly diminished by these known light-sensitive polymers.

The object of the invention is to provide polymers which can be crosslinked by light and which do not have the disadvantages of the known polymers described, that is to say which have a greater sensitivity towards electromagnetic waves, and in which, in addition, this sensitivity can also be further considerably increased by means of a combination with sensitisers.

The invention relates to polymers which can be crosslinked under the action of electromagnetic waves, have an average molecular weight of at least 1,000 and contain, per molecule, on average more than two maleimide groups of the formula I

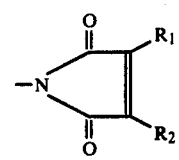
(I)

wherein $R_1$ and $R_2$ independently of one another denote alkyl groups with at most 4 carbon atoms, or $R_1$ and $R_2$ conjointly denote the remaining part of a five-membered to six-membered carbocyclic ring.

In particular, the polymers according to the invention contain the following maleimide groups of the formula I:

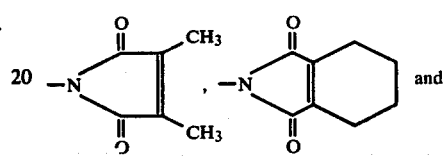

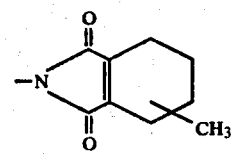

Those polymers which contain the first mentioned of the three maleimide groups are a particularly preferred form.

The polymers according to the invention are, in particular, polymeric compounds of the group comprising polyesters, polyester-amides, polyamides, polyimides, polyamideimides, polyester-amide-imides, polyethers, polyamines (including polyimines), polyurethanes, polycondensates based on phenol-formaldehyde (novolacs), polysaccharides, gelatine, organopolysiloxanes and polymers which are formed by homopolymerisation or copolymerisation of monomers containing reactive C=C double bonds.

Polymers according to the invention are, in particular, the following 7 types (A to G) of polymeric compounds:

(A) Homopolymers or copolymers of monomers which contain reactive C=C double bonds and have average molecular weights of between 1,000 and 1,000,000 and which contain the maleimide groups of the formula I in molecular chain members of the formulae

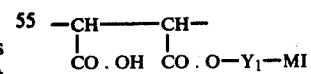

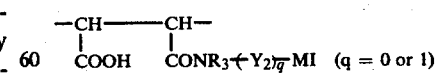 (q = 0 or 1)

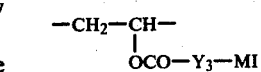

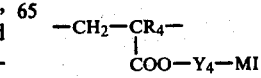

-continued

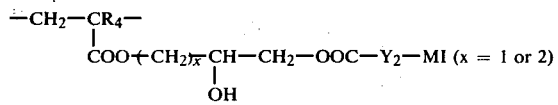

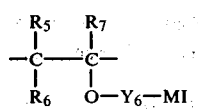

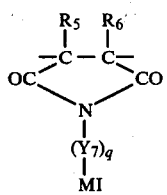

in which MI denotes the maleimide group of the formula I and $Y_2$ denotes an aliphatic or cycloaliphatic or carbocyclicaromatic or araliphatic or heterocyclic-aliphatic or heterocyclic-aromatic radical (containing, in each case, a total of at most up to 18 C atoms), and in which $Y_1$ has the same definition as $Y_2$ or represents the grouping

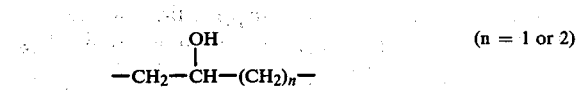

$Y_3$ has the same definition as $Y_2$ or represents the grouping

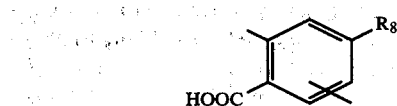

$Y_4$ has the same definition as $Y_2$ or represents the grouping

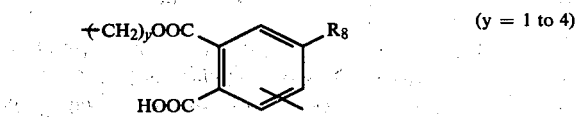

$Y_5$ has the same definition as $Y_2$ or represents the grouping

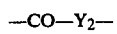

$Y_6$ has the same definition as $Y_2$ and preferably denotes an aliphatic or carbocyclic-aromatic radical and $Y_7$ has the same definition as $Y_2$ and q is preferably O, and in which $R_3$ denotes H or alkyl with 1 to 6 C atoms, $R_4$ denotes H or alkyl, preferably methyl, $R_5$, $R_6$ and $R_7$ independently of one another denote H, halogen, cyano, alkyl, aryl or aralkyl, but preferably H and $R_8$ denotes H, —COOH or —COO($CH_2$)$_z$$CH_3$ (z=0 to 18).

(The following is to be stated, in principle, with regard to the chemical formulae in this patent application: if divalent molecular radicals which are characterized by a symbol (for example "Y") and which represent parts of a basic formula are explained in more detail by further formulae, these divalent radicals are always spatially so indicated that they can be incorporated into the basic formula without rotation. The right-left arrangements of both the basic formula and of the formula of the particular divalent molecular radical explained in more detail are thus to be left unchanged).

When (A) concerns copolymers, these preferably contain, in addition to the molecular chain members carrying the maleimide groups, those molecular chain members which are derived from the following comonomers, which are free from maleimide groups: olefines, vinyl halides, for example vinyl bromide, vinyl chloride and vinyl fluoride, vinylidenes, for example vinylidene chloride, nitriles of α,β-unsaturated acids, for example acrylonitrile or methacrylonitrile, α,β-unsaturated acids and their esters or halogen derivatives, for example acrylic acid, methacrylic acid, crotonic acid, maleic acid, methyl methacrylate, ethyl acrylate, propyl acrylate, butyl acrylate, octyl acrylate, 2-ethyl-hexyl acrylate, ethyl methacrylate, isopropyl methacrylate, dimethylaminoethyl methacrylate, diethylaminoethyl acrylate, glycidyl methacrylate, glycidyl acrylate or chloromethyl methacrylate, α,β-unsaturated carboxylic acid amides and their derivatives, for example acrylamide and methacrylamide, aromatic vinyl compounds, for example styrene, methylstyrene, vinyltoluene or α-chlorostyrene, vinyl ketones, for example methyl vinyl ketone, vinyl esters, for example vinyl acetate, heterocyclic vinyl compounds, for example vinylpyridine and vinylpyrrolidone, vinyl ethers and compounds which have olefinic double bonds.

(B) Polyamides or polyamide-imides which have average molecular weights of between 1,000 and 50,000 and which contain the maleimide groups of the formula I in molecular chain members of the formulae

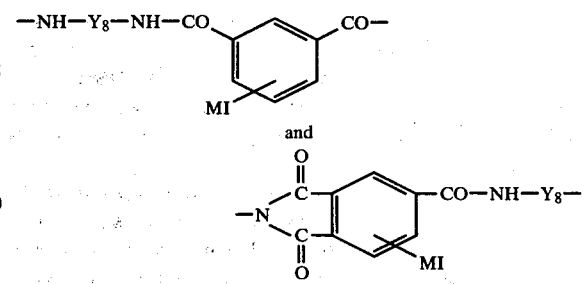

in which MI represents the maleimide group of the formula I and $Y_8$ represents an aliphatic radical with at least 2 C atoms or a cycloaliphatic or araliphatic or carbocyclicaromatic or heterocyclic-aromatic radical (with, in each case, at most up to 18 C atoms), or represents a radical of the formula

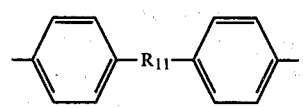

in which $R_{11}$ denotes —$CH_2$—,

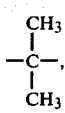

—SO$_2$—, —S— or —O—, and, in the case of the polyamides, the radical —NH—Y$_8$—NH— can also represent the grouping

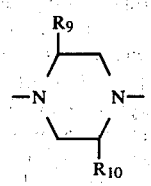

in which R$_9$ and R$_{10}$ independently of one another can be H, methyl or phenyl.

(B) also includes copolyamides and copolyamideimides which also contain, in addition to the molecular chain members carrying the maleimide groups, those molecular chain members which are derived from comonomers which are free from maleimide groups, that is to say from dicarboxylic acids or from tri- and tetracarboxylic acids and/or diamines which are capable of forming imides.

Examples of such carboxylic acids or their derivatives are: succinic acid, succinic anhydride, glutaric acid, adipic acid, suberic acid, sebacic acid and dodecanedicarboxylic acid, 1,3-cyclopentane-dicarboxylic acid, phthalic anhydride, hexahydroisophthalic acid, hexahydroterephthalic acid, terephthalic acid, isophthalic acid, 4,4'-dicarboxydiphenylethane, naphthalene-2,5-dicarboxylic acid, thiophene-2,5-dicarboxylic acid and pyridine-2,3-dicarboxylic acid as well as the corresponding dichlorides, diesters according to the definition and salts; trimellitic acid 1,2-anhydride-chloride (1,3-dioxo-benzo[c] oxalane-5-carboxylic acid chloride), trimellitic anhydride and the Na or ammonium salt, and esters according to the definition, of trimellitic acid; pyromellitic dianhydride, 3,3',4,4'-benzophenone-tetracarboxylic acid dianhydride, 2,3,3',4'-benzophenone-tetracarboxylic acid dianhydride, 2,2',3,3'-benzophenonetetracarboxylic acid dianhydride, 3,3',4,4'-diphenyl-tetracarboxylic acid dianhydride, bis-(2,3-dicarboxyphenyl)-methane dianhydride, bis-(2,5,6-trifluoro-3,4-dicarboxyphenyl)-methane dianhydride, 2,2-bis-(2,3-dicarboxyphenyl)-propane dianhydride, bis-(3,4-dicarboxyphenyl) ether dianhydride, bis-(3,4-dicarboxyphenyl)-sulphone dianhydride, N,N-(3,4-dicarboxyphenyl)-N-methylamine dianhydride, bis-(3,4-dicarboxyphenyl)-diethylsilane dianhydride and 2,3,5,7- and 1,2,5,6-naphthalene-tetracarboxylic acid dianhydride.

Examples which may be mentioned of diamines which are suitable for polycondensation are: o-, m- and p-phenylenediamine, diaminotoluenes, such as 2,4-diaminotoluene, 1,4-diamino-2-methoxybenzene, 2,5-diaminoxylene, 1,3-diamino-4-chlorobenzene, 4,4'-diamino-diphenylmethane, 4,4'-diaminodiphenyl ether, 4,4'-diaminodiphenyl thioether, 4,4'-diaminodiphenylsulphone, 2,2'-diaminobenzophenone, 4,4'-diaminodiphenylurea, 1,8- or 1,5-diaminonaphthalene, 2,6-diaminopyridine, 2,4-diaminopyrimidine, 2,4-diamino-s-triazine, di-, tri-, tetra-, hexa-, hepta-, octa- and decamethylenediamine, 2,2-dimethylpropylenediamine, 2,5-dimethylhexamethylenediamine, 4,4-dimethylheptamethylenediamine, 3-methylheptamethylenediamine, 3-methoxyhexamethyldiamine, 2,11-diaminododecane, 1,2-bis-(3-aminopropoxy)-ethane, N,N'-dimethylethylenediamine, N,N'-dimethyl-1,6-diaminohexane and the diamines of the formulae H$_2$N(CH$_2$)$_3$O(CH$_2$)$_2$O(CH$_2$)$_3$NH$_2$ and H$_2$N(CH$_2$)$_3$S(CH$_2$)$_3$NH$_2$ and 1,4-diaminocyclohexane, 1,4-bis-(2-methyl-4-aminopentyl)-benzene and 1,4-bis-(aminomethyl)-benzene.

(C) Polyesters which have average molecular weights of between 1,000 and 50,000 and which contain the maleimide groups of the formula I in molecular chain members of the formula

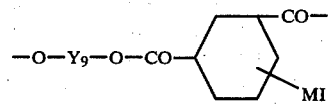

in which MI denotes the maleimide group of the formula I and Y$_9$ denotes an aliphatic radical with at least 2 C atoms or a cycloaliphatic or araliphatic or carbocyclic-aromatic or heterocyclic-aromatic or heterocyclic-aliphatic radical (with, in each case, a total of at most 18 atoms).

(C) also includes copolyesters which also contain, in addition to the molecular chain members carrying the maleimide groups, those molecular chain members which are derived from comonomers which are free from maleimide groups, that is to say from dicarboxylic acids or from dicarboxylic acid derivatives and/or diols which are capable of undergoing a condensation reaction.

Examples of such carboxylic acids, or their derivatives, are: succinic acid, succinic anhydride, glutaric acid, adipic acid, suberic acid, sebacic acid and dodecanedicarboxylic acid, 1,3-cyclopentane-dicarboxylic acid, phthalic anhydride, hexahydroisophthalic acid, hexahydroterephthalic acid, terephthalic acid, isophthalic acid, 4,4'-dicarboxydiphenylethane, naphthalene-2,5-dicarboxylic acid, thiophene-2,5-dicarboxylic acid and pyridine-2,3-dicarboxylic acid as well as the corresponding dichlorides, diesters according to the definition and salts; maleic acid and fumaric acid and their derivatives, trimellitic acid s1,2-anhydride-chloride (1,3-dioxo-benzo[c]oxalane-5-carboxylic acid chloride), trimellitic anhydride and the Na or ammonium salt, and esters according to the definition, of trimellitic acid; 2,3,3',4'-benzophenone-tetracarboxylic acid dianhydride, 2,2',3,3'-benzophenone-tetracarboxylic acid dianhydride, 3,3',4,4'-diphenyl-tetracarboxylic acid dianhydride, bis-(2,3-dicarboxyphenyl)-methane dianhydride, bis-(2,5-6-trifluoro-3,4-dicarboxyphenyl)-methane dianhydride, 2,2-bis-(2,3-dicarboxyphenyl)-propane dianhydride, bis-(3,4-dicarboxyphenyl)-ether dianhydride, bis-(3,4-dicarboxyphenyl)-sulphone dianhydride, N,N-(3,4-dicarboxyphenyl)-N-methylamino dianhydride, bis-(3,4-dicarboxyphenyl)-diethylsilane dianhydride and 2,3,5,7- and 1,2,5,6-naphthalene-tetracarboxylic acid dianhydride.

Examples which may be mentioned of diols which are suitable for a condensation reaction are: ethylene glycol, propylene glycol, 1,3-propanediol, 1,4- and 2,3-butanediol, 2,2-dimethyl-1,3-propanediol (neopentylglycol), 1,5- and 2,4-pentanediol, 1,6- and 2,5-hexanediol, 1,8-octanediol, 1,10-decanediol, 1,12-dodecanediol, 2-ethyl-2-butyl-1,3-propanediol, diethylene glycol, dipropylene glycol, 1,2-, 1,3- and 1,4- cyclohexanediol, 1,4-bis-(hydroxymethyl)-cyclohexane, 4-amino-cyclohexanol, 1,2-, 1,3- and 1,4-dihydroxybenzene, 1,2-dihydroxy-3-methoxybenzene, 1,2-dihydroxy-4-nitrobenzene, 2,6-dihydroxytoluene, 1,3-, 1,4-, 1,5- and 1,6-dihydroxynaphthalene, 2,2'-dihydroxybiphenyl, 4,4'-dihydroxy-biphenyl, 4,4'-dihydroxydiphenylylmethane, 2,2'-bis-(4-hydroxyphenyl)-propane (bisphenol A), 2,2'- and 4,4'-dihydroxy-diphenlyl ether, 3,3'- and 4,4'-dihydroxy-diphenylylsulphone, 2,4-dihydroxy-5-methyl-pyrimidine, 2,3-dihydroxypyridine and 3,6-dihydroxy-pyridazine.

(D) Polymers of the type comprising polyesters which have average molecular weights of at least 1,000, which have been formed by reactions of monomers containing epoxide groups with monomers containing carboxyl groups or anhydride groups and which contain the maleimide groups of the formula I in molecular chain members of the formulae

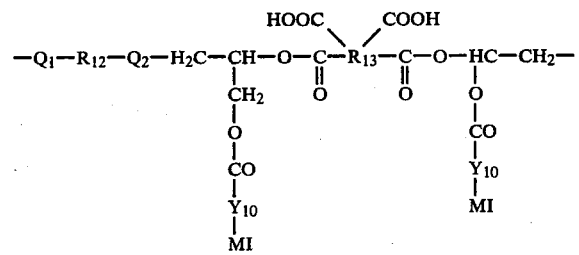

and

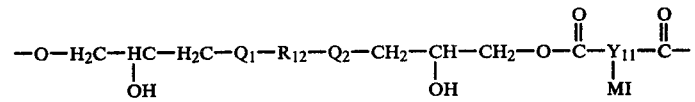

in which MI denotes the maleimide group of the formula I, $Q_1$ and $Q_2$ independently of one another denote —$NR_{16}$— or —O— and $R_{16}$ represents hydrogen, alkyl with 1–4 carbon atoms or phenyl, and $R_{12}$, $Y_{10}$ and $Y_{11}$ independently of one another denote an aliphatic or cycloaliphatic or carbocyclic-aromatic or heterocyclic-aromatic or heterocyclic-aliphatic radical (with, in each case, a total of at most 18 C atoms) and $R_{13}$ has the same definition as $R_{12}$ or represents one of the groupings

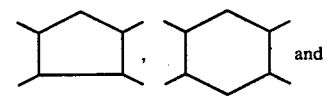

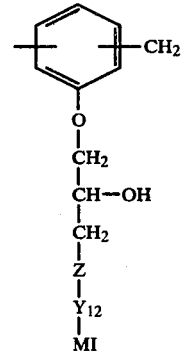

and in which, in the case of the first mentioned formula, the molecular radical —$Q_1$—$R_{12}$—$Q_2$— can also denote a group of the formulae

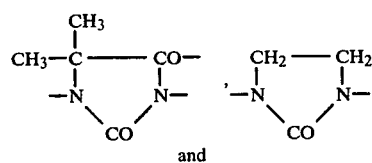
and

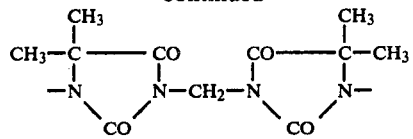

(D) also includes copolyesters which also contain, in addition to the molecular chain members carrying the maleimide groups, those molecular chain members which are derived from comonomers which are free from maleimide groups, that is to say from monomers which have, for example, two glycidyl groups, dicarboxylic acids and anhydrides or dianhydrides.

(E) Polycondensates based on phenol-formaldehyde (novolacs) which have average molecular weights of at least 1,000 and which contain the maleimide groups of the formula I in molecular chain members of the formula

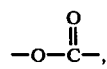

in which MI represents the maleimide group of the formula I and $Y_{12}$ represents an aliphatic or cycloaliphatic or carbocyclic-aromatic or heterocyclic-aliphatic or heterocyclicaromatic radical (with, in each case, a total of at most 18 C atoms), Z denotes one of the groupings —S—, $$-O-\overset{O}{\underset{\|}{C}}-,$$

—$NR_{16}$— or —O— and $R_{16}$ represents hydrogen, alkyl with 1-4 C atoms or phenyl.

(E) also includes those novolacs in which free glycidyl groups and/or free OH groups are also present, in addition to the molecular chain members carrying the maleimide groups, such as, for example, novolacs corresponding to the following formula:

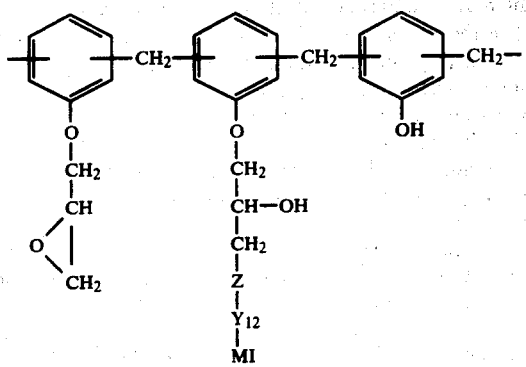

After irradiation, such condensates, which have some free epoxide groups, can optionally be post-cured by means of epoxide curing agents which are active under hot conditions, in particular catalytic curing agents, such as dicyandiamide. The products post-cured in this way display a higher ability for resisting heat than those crosslinked by irradiation only.

(F) Polyethyleneimines which have average molecular weights of between 1,000 and 1,000,000 and which contain the maleimide groups of the formula I in molecular chain members of the formulae

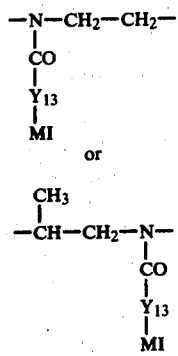

in which MI denotes the maleimide group of the formula I and $Y_{13}$ denotes an aliphatic or cycloaliphatic or carbocyclicaromatic or heterocyclic-aliphatic or heterocyclic-aromatic radical (with, in each case, a total of at most 18 C atoms).

(G) Polymers based on a polyether (especially phenoxy resins) which have average molecular weights of 1,000 to 1,000,000 and which contain the maleimide groups of the formula I in molecular chain members of the formula

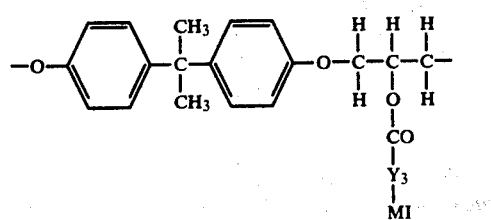

in which MI denotes the maleimide group of the formula I and $Y_3$ denotes an aliphatic or cycloaliphatic or carbocyclicaromatic or araliphatic or heterocyclic-aliphatic or heterocyclic-aromatic radical (containing, in each case, a total of at most up to 18 C atoms) or denotes the grouping

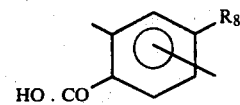

and $R_8$ represents —H, —COOH or —CO $O(CH_2)_zCH_3$ (z=0 to 18).

The polymers according to the invention can be manufactured according to methods of synthesis which are in themselves known for the manufacture of macromolecules which have photoactive side groups (which are also termed pendant or hanging groups). In principle, the following routes can be used:

1. Incorporation of the light-sensitive group into an existing polymer chain and
2. Synthesis of the polymer chain from monomers which already contain the light-sensitive maleimide groups, it being possible to synthesise the polymer chain by 2.1. polymerisation or 2.2. a polyaddition reaction or 2.3. a polycondensation reaction. It should be noted that the same products can be obtained with methods 1 and 2, so that in many cases it is possible to use method 1 or method 2, as desired.

If the light-sensitive maleimide groups are incorporated by means of a secondary reaction into a polymer chain which already exists, this incorporation is effected either by means of a condensation reaction, with the elimination of $H_2O$, $H_2S$, a hydrogen halide or the like, or by means of an addition reaction with simultaneous opening of a ring system, such as, for example, of a dicarboxylic acid anhydride group or of an epoxide group.

In the case of a condensation reaction, either the polymer contains side groups of the type —OH, —SH, —$NH_2$, alkyl-NH—, aryl—NH— or the like, and the compound which contains the maleimide group and is to be condensed with the polymer contains groups of the type —CO·Cl, —CO·OH or the like, or the conditions at the start are reversed, that is to say the starting polymers contain side groups of the type —CO·Cl, —CO·OH or the like, and the compound which contains the maleimide group and is to be condensed with the polymer contains the partner groups suitable for the condensation reaction, that is to say —OH, SH and the like. The condensation reaction is carried out according to known methods, preferably in solution.

When the maleimide group is incorporated into the polymer by means of an addition reaction either the starting polymer contains, as a chain member or as a side group, the dicarboxylic acid anhydride group or epoxide group suitable for the addition reaction and the compound which contains the maleimide group and is to be added onto the polymer contains the group suitable for opening the particular ring, such as, for example, —OH, —$NH_2$ and the like, or the conditions are reversed, that is to say the compound which contains the maleimide group and is to be added onto the polymer contains the dicarboxylic acid anhydride group or epoxide group and the starting polymer contains the group suitable for opening the ring, that is to say —OH, —$NH_2$ and the like. These addition reactions are also carried out according to known processes, such as are described in large numbers in the literature.

The products which follow may be listed as starting polymers which are suitable for introducing the light-sensitive maleimide groups of the formula I by a condensation or addition reaction: polyacrylic acid, polymethacrylic acid, copolymers of these acids and other ethylenically unsaturated monomers, copolymers synthesised from maleic anhydride and ethylenically unsaturated monomers such as methyl vinyl ether, ethylene, styrene, hexene-1, decene-1, tetracene-1 and octadecene-1, polymers which have isocyanate and isothiocyanate groups, polymers which have free hydroxyl groups, such as monomers or copolymers of acrylic acid hydroxyalkyl esters and methacrylic acid hydroxyalkyl esters, polyvinyl alcohols, natural or regenerated cellulose, cellulose derivatives, hydroxyalkylcellulose, polyethers based on the phenoxy resins, phenol-formaldehyde polycondensates (novolacs), polymers which have free glycidyl groups, such as copolymers based on acrylic acid glycidyl esters and methacrylic acid glycidyl esters, polyimines and polymers which have free amino groups, such as, for example, poly-p-aminostyrene.

Examples of solvents which can be used in the condensation and addition reactions described are N-methylpyrrolidone, dimethylformamide, dimethylacetamide, cyclohexanone, ethyl methyl ketone, isopropyl methyl ketone, γ-butyrolactone, pyridine, tetrahydrofurane, dioxane, tetramethylurea, hexametapol and sulpholane. The modified polymers can be precipitated by adding a small amount of a slightly polar solvent. Examples of slightly polar solvents are diethyl ether, isopropanol, hexane, cyclohexane, benzene, toluene and chlorobenzene. This generally advantageous method on the one hand leads to readily soluble polymers and on the other hand permits clean separation of the polymers from the low-molecular constituent of the reaction mixture.

Catalysts which promote the desired linking can be added to the reaction solution. Thus, for example, the addition of tertiary amines, p-toluenesulphonic acid, sulphuric acid or Lewis acids is advantageous for the formation of esters.

When the polymers according to the invention are manufactured by synthesis from monomers which already contain the light-sensitive maleimide groups of the formula I and optionally from additional comonomers which are free from maleimide groups, very specific reaction conditions must be observed depending on the nature of the particular polymerisation, polyaddition reaction or polycondensation reaction. These reaction conditions and in particular data on the quantity ratios, temperatures, catalysts, accelerators, solvents and the like are also described in detail in the literature.

More precisely, the following should also be mentioned in detail in this connection: Re 2.1. (polymerisation)

In the case of known systems, the homopolymerisation or copolymerisation, by free radical polymerisation, of monomers which contain more than one reactive C═C double bond leads to crosslinked products. It is true that it is possible so to polymerise suitable monomers, such as, for example, vinyl ether derivatives of cinnamic acid, by cationic mechanisms that only one C═C double bond is incorporated into the polymer, as has been described by Kato and Hasegawa (Polymer Letters 8 [1970]). However, carrying out the reaction in this way is very involved and therefore technologically not economical. It has now been found that monomers which also contain, in addition to the double bond present in the maleimide radical of the formula I, a further ethylenically unsaturated double bond which can be polymerised more easily than the maleimide group of the formula I, surprisingly polymerise, by means of free radical initiators, for example by means of organic peroxides, such as dilauroyl peroxide, didecanoyl peroxide, dibenzoyl peroxide or dicumyl peroxide, organic peroxycarbonates, such as dicyclohexyl peroxydicarbonate and di-sec.-butyl peroxydicarbonate, di-tert.-butyl perbenzoate, inorganic per-compounds, such as hydrogen peroxide, potassium persulphate and ammonium persulphate, or azo compounds, such as azoisobutyronitrile or azo-bis-(2,4-dimethylvaleronitrile) or with the aid of redox systems, such as, for example, $Fe^{2+}/H_2O_2$, in such a way that polymers are obtained which do not have a crosslinked structure and which contain the light-active imidyl groups as side substituents which, according to the invention, can subsequently be crosslinked by electromagnetic waves.

A further subject of the invention is thus also a process for the manufacture of the homopolymers and copolymers characterised under (A), which process is characterised in that a monomer which on the one hand contains a maleimide radical of the formula I and on the other hand contains a group which differs from the ethylenically unsaturated group present in this maleimide radical but which is also ethylenically unsaturated and which can be polymerised more easily than the maleimide group of the formula I, is polymerised, optionally together with other ethylenically unsaturated compounds which can be copolymerised, by means of free radical initiators. This process is preferably carried out "in solution". In principle, however, a polymerisation in bulk or in heterogeneous phase, such as emulsion polymerisation, suspension polymerisation or precipitation polymerisation, using the initiators described is also possible. This polymerisation process is also carried out by conventional methods.

According to the invention, the compounds employed as the monomers which on the one hand contain a maleimide radical of the formula I and on the other hand contain a group which differs from the ethylenically unsaturated group present in this maleimide radical but which is also ethylenically unsaturated are, preferably, those compounds which contain, as the last-mentioned group, a group from the series

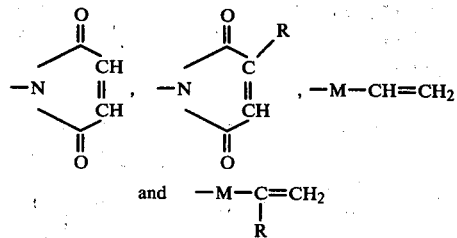

in which R denotes an alkyl group with at most 4 C atoms and M denotes oxygen or one of the radicals —O·CO—, —NH·CO— or —CO·NH·CO—.

The maleimide monomers to be used according to the process of the invention can be either homopolymerised or copolymerised. Examples of suitable comonomers are α-olefines, such as ethylene, propylene and isobutylene, vinyl compounds, such as vinyl chloride, vinylidene chloride, vinyl acetate, vinylpyridine, vinylpyrrolidone, styrene, methylstyrene, vinyl ketones, vinyl ethers, vinylimidazoles, vinylcarbazoles and vinylsulphonic acids, allyl compounds, acrylic and methacrylic compounds, such as acrylic acid and the esters thereof or methacrylic acid and the esters thereof, acrylamide, acrylonitrile, methacrylamide and methacrylonitrile, dicarboxylic acids and the esters thereof, such as fumaric acid or maleic acid, maleic anhydride and maleimides, and also, in some cases, dienes, such as butadiene, chlorobutadiene, isoprene or chloroprene.

If the polymerisation is carried out in solution, solvents which can be used are inter alia, depending on the nature of the monomers used, those which follow: water, toluene, benzene, tetrahydrofurane, ethyl acetate, ethylglycol and derivatives thereof, dioxane, acetone, dimethylformamide, dimethylacetamide and halogenated hydrocarbons or mixtures of such solvents. Depending on the choice of the solvent and of the reaction temperature, the initiators used will be the free-radical initiators mentioned or redox systems, in concentrations of 0.01 to 5 percent by weight, preferably of 0.1-2.5 percent by weight, based on the monomer concentration.

Depending on the choice of the solvent and of the initiator, the reaction temperature is between 0 and 150° C., preferably between 20° and 120° C. When the reaction has ended, the polymer can be isolated either by distilling off the solvent or by precipitation in a solvent in which the polymer is insoluble. Depending on the concentration of the initiator and on the reaction temperature, the average molecular weight of polymers manufactured in this way is 1,000 to 2,000,000; a molecular weight of 10,000 to 50,000 is preferably chosen. The molecular weight can optionally be influenced by the addition of regulators, such as mercaptans, for example dodecylmercaptan, or allyl derivatives, for example allyl alcohol. Re 2.3. (polycondensation reaction)

In order to manufacture products according to the invention by means of a polycondensation reaction it is possible, for example, to use compounds which contain a maleimide radical of the formula I and which, together with corresponding compounds which do not contain the maleimide radical, are able to form polycondensates. Polycondensation of compounds which contain at least two carboxylic acid groups, or of reactive derivatives of such dicarboxylic and polycarboxylic acids, with compounds which contain at least two groups which are able to react with the optionally functionally modified carboxylic acid groups, in particular dihydroxy compounds (including diepoxy compounds) and diamino compounds, hydroxyamino compounds and also monoepoxides and carboxylic acid anhydrides is preferred. At least one of the components in the condensation reaction contains a maleimide group of the formula I. In general it is appropriate if, in addition to the component containing the maleimide radical, a corresponding component which does not contain this radical is also co-condensed. The presence of the maleimide radical in the carboxylic acid component is particularly preferred.

Examples which may be mentioned of such polycondensed compounds which contain the radical of the formula I are: 5-dimethylmaleimidylbenzene-1,2,4-tricarboxylic acid (obtainable from aminotrimellitic acid and dimethylmaleic anhydride), 5-dimethylmaleimidylbenzene-1,2-(dicarboxylic acid anhydride)-4-carboxylic acid chloride (conversion of the tricarboxylic acid into the 1,2-dicarboxylic acid anhydride and reaction of the latter with thionyl chloride), 5-dimethylmaleimidylbenzene-1,2-(dicarboxylic acid anhydride)-4-carboxylic acid ethyl ester (from the acid chloride), 5-dimethylmaleimidylbenzene-1,3-dicarboxylic acid dichloride and N-glycidyl-dimethylmaleimide.

An acid chloride, esters, anhydride-chlorides or dianhydrides and, in the case of diepoxy compounds, also dicarboxylic acids and, in the case of monoepoxides, carboxylic acid anhydrides are preferably employed for the polycondensation reactions.

In other respects the polycondensation reaction can be carried out in a manner which is in itself known, for example in a solvent at temperatures of −20° C. to +30° C. Examples of solvents which can be used are: aromatic hydrocarbons, such as benzene, toluene and xylenes; optionally halogenated aliphatic hydrocarbons, such as pentane, n-hexane, methylene chloride, chloroform and dichloromethane; aliphatic and cycloaliphatic ketones, such as acetone, methyl ethyl ketone, cyclopentanone and cyclohexanone; cyclic ethers, such as tetrahydrofurane, tetrahydropyrane and dioxane; cyclic amides, such as N-methyl-2-pyrrolidone, N-acetyl-2-pyrrolidone and N-methyl-ε-caprolactam; N,N-dialkylamides of aliphatic monocarboxylic acids which have 1–3 carbon atoms in the acid part, such as N,N-dimethylformamide, N,N-dimethylacetamide, N,N-diethylacetamide and N,N-dimethyl-methoxyacetamide; alkyl esters of aliphatic monocarboxylic acids which contain a total of 2 to 6 carbon atoms, such as formic acid methyl, ethyl and n-butyl esters or acetic acid methyl, ethyl and n-butyl esters; hexamethylphosphoric acid triamide (hexametapol); N,N,N',N'-tetramethylurea, tetrahydrothiophene dioxide (sulpholane) and dialkylsulphoxides, such as dimethylsulphoxide and diethylsulphoxide.

The polycondensation reactions can also be carried out in the melt in the presence of customary polycondensation catalysts at temperatures of about 150° to 280° C.

Catalysts which can be used are, for example, antimony compounds, such as antimony triacetate or antimony trioxide, zinc acetate, calcium acetate, germanium compounds or alkali metal salts of organic carboxylic acids.

The polymers according to the invention are suitable for various uses, but in particular for crosslinking under the action of electromagnetic waves.

Crosslinking leads to insoluble prodcuts and makes it possible to produce relief images by image-wise exposure and subsequent developing, that is to say dissolving out the proportion of the polymer which was not exposed and therefore not crosslinked.

In this application it is important that the sensitivity of the polymers to light can be quite considerably incresed by sensitisation, and this represents a particularly great advance compared with polymers of the state of the art.

Suitable sensitisers are, in particular, triplet sensitisers, the use of which effects crosslinking by means of triplet energy transfer from the excited sensitiser to the maleimide radical of the formula I which is not excited; in this context compare N. J. Turro, "Mol. Photochemistry", W. A. Benjamin Inc. [1965], page 107. The two conditions for effective sensitisation are as follows:

1. The triplet sensitiser must display an absorption maximum which permits a light absorption, in the range of more than 300 nm, which is adequate for practical purposes and 2. The triplet energy transfer must be exothermic.

It has been found that the polymers containing the maleimide radical of the formula I have a $T_1$ state which lies between 50 and 53 kilogram-calories per mol and therefore, from the start, all the triplet sensitisers which permit exothermic energy transfer in the range mentioned, that is to say which have a $T_1$ state of at least 50 kcal/mol. are suitable for sensitising. For example, the following sensitisers can be used. (The figures give the particular triplet energies in kcal/mol).

| | | | |
|---|---|---|---|
| Benzene | 85 | Carbazole | 70 |
| Phenol | 82 | Triphenylamine | 70 |
| Benzoic acid | 78 | Hexachlorobenzene | 70 |
| Benzonitrile | 77 | 4,4-Diphenylcyclohexadienone | 69 |
| Aniline | 77 | 1,2-Dibenzoylbenzene | 69 |
| Xanthone | 74 | Thiophene | 69 |
| Acetophenone | 74 | Benzophenone | 69 |
| Diisopropyl ketone | 74 | 1,4-Diacetylbenzene | 68 |
| Diphenyl sulphide | 74 | Fluorene | 68 |
| Diphenylamine | 72 | Triphenylene | 67 |
| Benzaldehyde | 72 | 4-Cyanobenzophenone | 66 |
| Diphenylselenium | 72 | Diphenyl | 65 |
| Thioxanthone (also halogen-substituted) | 65 | Acridine yellow | 58 |
| | | 1-Naphthyl phenyl ketone | 57 |
| Phenylglyoxal | 63 | Chrysene | 57 |
| Anthraquinone | 62 | 1-Acetonaphthol | 56 |
| Quinoline | 62 | 1-Naphthaldehyde | 56 |
| Phenanthrene | 62 | Diacetyl | 55 |
| Flavone | 62 | Coronene | 55 |
| Michler's ketone | 61 | Benzil | 54 |
| Naphthalene | 61 | Fluorenone | 53 |
| 4-Acetyldiphenyl | 61 | Fluorescein (acid) | 51 |
| Nitrobenzene | 60 | p-Nitrostilbene | 50 |
| 2-Acetonaphthene | 59 | | |

The following should also be mentioned

| | | | |
|---|---|---|---|
| Anthrone | 72 | 5-Nitroacenaphthene | 56.6 |
| Benzanthrone | 72 | 4-Nitroaniline | 55 |
| 2-Nitrofluorene | 59 | Naphthothiazoline | 55 |
| Quinoxaline and substitution products | 55 to 59 | 1-Acetylamino-4-nitro-naphthalene | 52.5 |
| 4-Nitrodiphenyl | 58 | | |

The triplet yield, and thus the sensitivity, can be increased by introducing elements which have a high atomic weight, for example iodine or bromine.

The possibilities for use of the polymers according to the invention lie, for example, in the field of photoproduction processes, the manufacture of printing plates and photographic processes which do not use silver compounds. In the case of photographic processes which do not use silver compounds, the polymer image which is barely to poorly visable can, after exposure and developing, be rendered readily visible by staining with oil-soluble dyestuffs or, when the polymer contains acid groups such as carboxylic acid groups or sulphonic acid groups, by staining with cationic dyestuffs. In the present case also, the light-active layers can be applied to suitable carrier materials by the customary techniques, such as spray coating, whirler coating, cascadecasting coating and curtain coating.

EXAMPLES

Several instructions for manufacturing the compounds which are to be used according to the examples and which contain the maleimide groups of the formula I (both monomers which can be processed to polymers and substances for the modification of already existing polymers) are described in the text which follows.

(a) N-(4-Hydroxycyclohexyl)-dimethylmaleimide 126 g (1 mol) of dimethylmaleic anhydride and 115 g (1 mol) of 4-aminocyclohexanol are warmed, in an oil bath whilst stirring, to 120° to 125° C. (internal temperature) for 30 minutes. After cooling to 20° C., the reaction product is dissolved in 500 ml of methylene chloride and extracted once with 100 ml of 1 N NaOH, whilst cooling with ice. The reaction product is then washed twice with water and dried over sodium sulphate. The solvent is evaporated and the residue is recrystallised from a 1:1 mixture by volume of ethyl acetate and petroleum ether. 155 g (70% of theory) of N-(4-hydroxycyclohexyl)-dimethylmaleimide are obtained; melting point 109° to 111° C.

(b) 4-Dimethylmaleimidylbenzene-1-carboxylic acid

According to instruction a, using p-aminobenzoic acid in place of aminocyclohexanol.

(c) 4-Dimethylmaleimidylbenzene-1-carboxylic acid chloride

This compound is manufactured in the customary manner from the carboxylic acid obtainable according to b, using thionyl chloride.

(d) α-Dimethylmaleimidyl-hydroxyalkanes

Some of these compounds (the hydroxyethyl compound and the 3-hydroxypropyl compound) are known and the other compounds can be manufactured in the same way as the known compounds; this applies, for example, in the case of the 6-hydroxyhexyl compound, the 2-methyl-2-hydroxyethyl compound and maleimidylalkanols which have a fused ring, such as

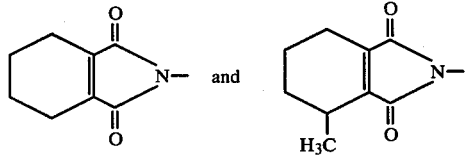

(e) 6-Dimethylmaleimidyl-caproic acid 145 g (1.15 mols) of dimethylmaleic anhydride and 150 g (1.15 mols) of ε-amino-caproic acid are dissolved in 700 ml of anhydrous acetic acid and the solution is boiled under reflux for 8 hours. The acetic acid is then distilled off in a rotary evaporator. The residue is dissolved in 500 ml of diethyl ether and washed once with 100 ml of 1 N NaOH, whilst cooling with ice, and twice with water. After drying over sodium sulphate and evaporating the diethyl ether, the residue is crystallised from 150 ml of isopropyl ether. 209 g (76% of theory) of 6-dimethylmaleimidyl-caproic acid are obtained; melting point 43° to 45° C.

(f) 6-Dimethylmaleimidyl-caproic acid chloride

This compound is obtained from the carboxylic acid obtainable according to e, by means of thionyl chloride.

(g) Dimethylmaleimidyl-acetic acid

According to instruction a, using glycocoll in place of aminocaproic acid.

(h) 5-Dimethylmaleimidylbenzene-1,3-dicarboxylic acid 76.5 g (0.34 mol) of disodium 5-amino-isophthalate are dissolved in 200 ml of water at 40° to 50° C. in a 1 liter three-necked flask which is provided with a reflux condenser and a stirrer. 44.2 g (0.35 mol) of dimethylmaleic anhydride, dissolved in 300 ml of dimethylacetamide, are added to this solution, whilst stirring. The pale yellowish solution is then boiled for 30 minutes at 100° C., whilst stirring continuously. The solution is then acidified (Congo Blue), at a temperature of 95° to 100° C., with 10% strength hydrochloric acid. The resulting precipitate is filtered off after the mixture has cooled to room temperature. The crude product is dried in vacuo at 90° C. 68.5 g (70% of theory) of 5-dimethylmaleimidyl-isophthalic acid are obtained; melting point above 250° C.

(i) 5-Dimethylmaleimidylbenzene-1,3-dicarboxylic acid dichloride 50.9 g (0.176 mol) of N-(dimethylmaleimidyl)-isophthalic acid (see h), together with 500 ml of thionyl chloride, are boiled under reflux, in a 1 liter single-necked flask, which is provided with a reflux condenser, until a clear solution has formed. 5 drops of pyridine are added in order to catalyse the reaction. The reaction mixture is then evaporated to dryness in a rotary evaporator, an orange-red residue being obtained.

The orange-red residue is then extracted with anhydrous cyclohexane in a hot extractor, the acid chloride being obtained. After cooling to 20° C., the acid chloride which has precipitated out is separated off by filtration and recrystallised from cyclohexane (20 g of acid chloride/500 ml of cyclohexane).

Yield: 39.3 g (80.2% of theory); melting point 115.5° to 116.5° C.

(j) 5-Dimethylmaleimidylbenzene-1,2,4-tricarboxylic acid 102.05 g (0.4 mol) of 5-nitrotrimellitic acid are suspended in 260 ml of water and 48 g (1.2 mols) of sodium hydroxide, dissolved in 240 ml of water, are added. The resulting solution is hydrogenated at 42° C. in the presence of 10 g of a palladium-on-charcoal catalyst containing 5% by weight of Pd. The reaction solution is filtered, the filtrate is concentrated to a volume of 150 ml and first 75 ml of toluene and then 50.44 g (0.4 mol) of dimethylmaleic anhydride are added and the mixture is boiled under reflux for 10 minutes. The reaction mixture is evaporated to dryness, the residue is dissolved in 500 ml of hot water and the solution is acidified with 438 ml of 10% strength hydrochloric acid and cooled to 0° to 5° C. and 14 ml of 32% strength hydrochloric acid are added. The precipitate which has separated out is filtered off, rinsed with 50 ml of ice water and dried at 80° C. in a drying cabinet. The yield of 5-dimethylmaleimidyl-trimellitic acid is 111.1 g (83% of theory).

(k) 5-Dimethylmaleimidylbenzene-1,4-(dicarboxylic acid anhydride)-4-carboxylic acid 140 ml of acetic anhydride are added to 76.64 g (0.23 mol) of the dimethylmaleimidyltrimellitic acid prepared according to the preceding instruction j and the mixture is heated to the boil. The acid dissolves completely within a short time. The solution is evaporated to dryness, the residue is boiled with 180 ml of benzene and the precipitate is filtered off and dried at 80° C. in a drying cabinet. 51.8 g (71% of theory) of 5-dimethylmaleimidyl-trimellitic anhydride are obtained; melting point 181° to 185° C.

(l) 5-Dimethylmaleimidylbenzene-1,4-(dicarboxylic acid anhydride)-4-carboxylic acid chloride 50.43 g (0.16 mol) of the 5-dimethylmaleimidyltrimellitic anhydride prepared according to instruction k are suspended in 320 ml of benzene, 17.5 ml (0.24 mol) of thionyl chloride and 0.5 ml of N,N-dimethylformamide are added and the mixture is heated 90° C., whilst stirring. The turbid solution which has formed after boiling for 15 minutes is filtered and the filtrate is cooled. 5-Dimethylmaleimidyl-trimellitic anhydride-chloride, which has crystallised out over sodium acetate, is dried at 80° C./0.5 mm Hg. Yield: 29.6 g (55% of theory); melting point 184° to 185° C.

(m) 5-Dimethylmaleimidylbenzene-1,4-(dicarboxylic acid anhydride)-4-carboxylic acid n-dodecyl ester 23.35 g (0.07 mol) of the 5-dimethylmaleimidyl-trimellitic anhydride-chloride prepared according to instruction 1 are dissolved in 70 ml of dioxane, 13.04 g (0.07 mol) of lauryl alcohol, dissolved in 25 ml of dioxane, are added, whilst stirring, and the mixture is left to stand overnight. The solution is then evaporated.

35 ml of diethyl ether are added to the residue. After stirring for three hours, 35 ml of cyclohexane are added to the fine crystalline suspension which has formed and the precipitate is filtered off and dried at 50° C. in a drying cabinet. 24 g (71% of theory) of 5-dimethylmaleimidyl-trimellitic anhydride lauryl ester are obtained; melting point 93° C.

(n) 3-Dimethylmaleimidylbenzene-1,2-dicarboxylic acid anhydride 100 g (0.44 mol) of disodium 3-aminophthalate are dissolved in a mixture of 90 ml of water and 45 ml of toluene by warming slightly. 55.9 g (0.44 mol) of dimethylmaleic anhydride are then added to this solution. The mixture is then heated to the reflux temperature and boiled under reflux for 10 minutes, whilst stirring. After cooling, the mixture is rendered acid to Congo Blue using 10% strength hydrochloric acid. A yellow precipitate forms and is separated off by filtration and dried in vacuo at 100° C.

Yield (crude product): 102.4 g (80% of theory).

Melting point: 203° C. (recrystallised from water).

102.4 g (0.35 mol) of 3-(N-dimethylmaleimidyl)-phthalic acid are mixed with 300 ml of acetic anhydride and this mixture is heated to 130° C. under reflux. It is then boiled under reflux for 10 minutes, whilst stirring. After cooling, the mixture is evaporated to dryness, 100 ml of benzene are then added to the residue and the mixture is again evaporated to dryness. The residue is then recrystallised from 200 ml of toluene.

(o)
N-[6-Methyl-4-oxa-5-oxo-hept-6-enyl]-dimethylmaleimide

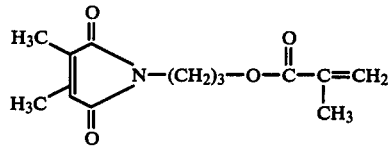
(Z II)

183.0 g (1.0 mol) of 3-hydroxypropyl-dimethylmaleimide and 111.3 g (1.1 mols) of triethylamine (dried over NaOH) are dissolved in 400 ml of diethyl ether (dried over Na) and the solution is cooled to 0° C.

104.5 g (1.0 mol) of methacrylic acid are allowed to run dropwise into this solution at such a rate that the temperature does not exceed 10° C.

When the reaction has ended, the mixture is stirred until the reaction mixture has warmed up to room temperature. The triethylamine hydrochloride which has precipitated during the reaction is now separated from the remaining reaction solution by filtration. The ether extract is washed with slightly acidified water until neutral, dried with sodium sulphate and then concentrated in vacuo without heating. About 224 g (89.3% of theory) are obtained.

Analogous manufacturing instructions apply for the compounds of the following formulae:

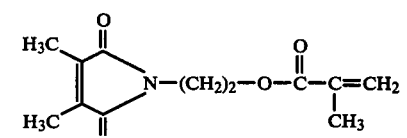
(Z I)

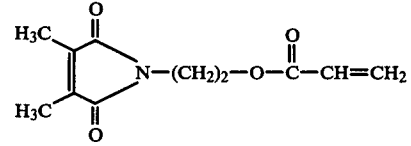
(Z XII)

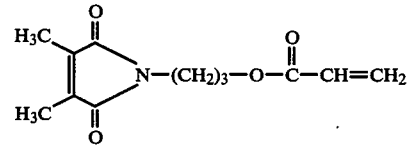
(Z III)

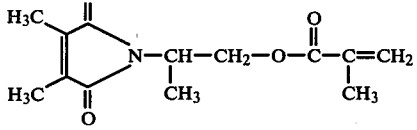
(Z XIII)

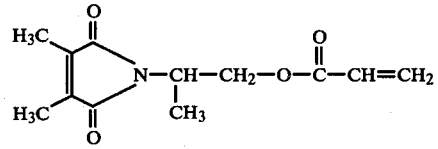
(Z XIV)

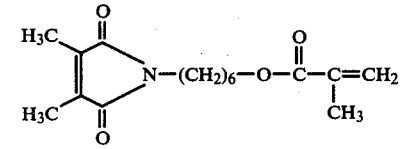
(Z IV)

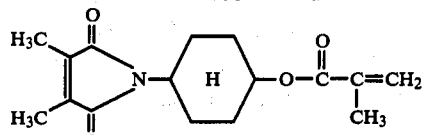
(Z XV)

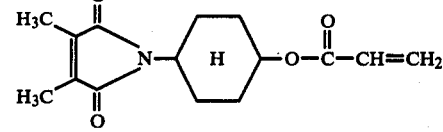
(Z V)

and

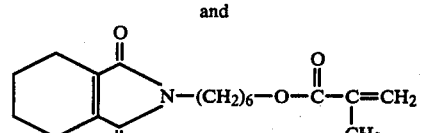
(Z XI)

p) Acrylamide derivative

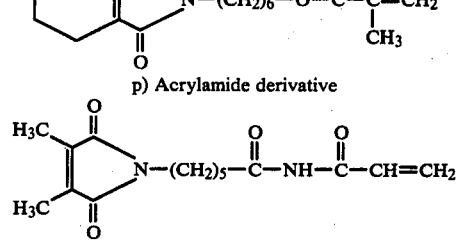
(Z XVI)

71.0 g (1.0 mol) of acrylamide and 101.25 g of triethylamine, dissolved in 200 ml of absolute acetone, are initially introduced. 257.5 g (1.0 mol) of 6-dimethyl-maleimidyl-caproic acid chloride (compare instruction f), dissolved in 400 ml of absolute acetone, are then allowed to run in dropwise, whilst cooling with ice/water, at such a rate that the temperature does not exceed 40° C. When the reaction has ended, the mixture is stirred for a further one hour.

The triethylamine hydrochloride which has formed is then separated from the remaining reaction solution by filtration. The acetone extract is concentrated in vacuo without heating. For further working up, the residue is taken up in 1,000 ml of diethyl ether and washed with 4 times 1,000 ml of water. After drying with sodium sulphate, the ether phase is concentrated in vacuo without heating. 208.0 g (71.2% of theory) are obtained.

(g)
N-[1-Aza-3-methyl-2-oxo-but-3-enyl]-dimethylmaleimide

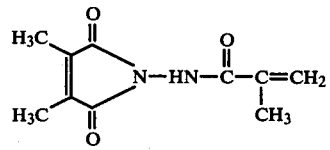
(Z IX)

140.0 g (1.0 mol) of N-amino-dimethylmaleimide and 111.3 g (1.1 mols) of triethylamine (dried over NaOH) are dissolved in 2,500 ml of dichloromethane and the solution is cooled to 0° C. 104.5 g (1.0 mol) of methacrylic acid chloride are allowed to run dropwise into this solution at such a rate that the temperature does not exceed 10° C. When the reaction has ended, the mixture is heated to 40° C. and then stirred for one hour at this temperature.

After cooling to room temperature, the reaction solution is washed with water until neutral. The dichloromethane extrat is dried over magnesium sulphate and then concentrated to dryness in vacuo, without heating. About 187 g (90% of theory) are obtained.

(r) Phthalic acid derivative

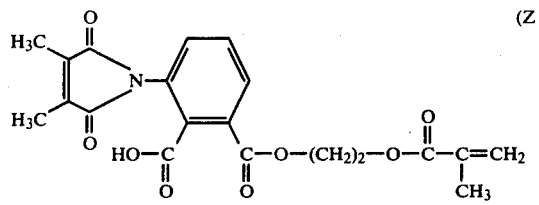
(Z VI)

27.1 g (0.1 mol) of 3-methylmaleimidyl-phthalic anhydride and 13 g (0.1 mol) of freshly distilled 2-hydroxyethyl methacrylate are dissolved in 500 ml of tetrahydrofurane. 0.5 ml of triethylamine and 0.05 g of hydroquinone are added to this solution. The mixture is now stirred for 24 hours at 50° C. and under dry nitrogen. When the reaction has ended, the solvent is evaporated off by means of a rotary evaporator. The residual oil is taken up in 500 ml of ether and the ether solution is washed first with 100 ml of 0.5 N sodium hydroxide solution and then with twice 200 ml of water. The ether solution is then evaporated, about 39 g (98% of theory) of a pale yellowish, highly viscous oil being obtained.

Analogous manufacturing instructions apply in the case of the compounds of the following formulae:

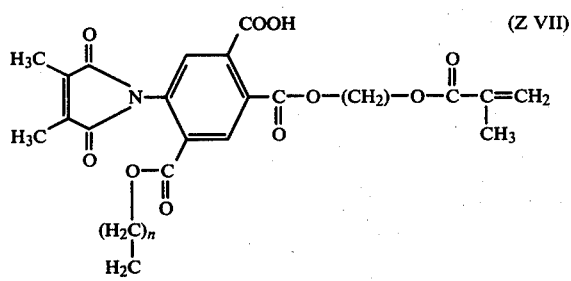
(Z VII)

and

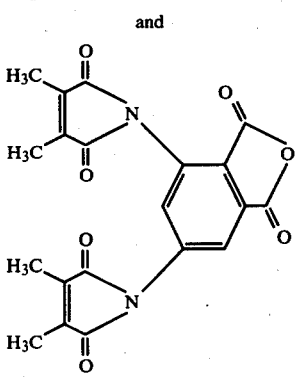
(Z XVII)

(s) N-Glycidyl-dimethylmaleimide 28 g (0.224 mol) of dimethylmaleimide are suspended in 600 ml of toluene, the suspension is heated to the boil and any water which may be present is distilled off as an azeotrope. 12.5 g (0.224 mol) of potassium hydroxide powder are added slowly and the mixture is kept at the boil for 2 hours, approximately the theoretical amount of water (4.5 ml) being collected. After cooling, the mixture is filtered and the potassium dimethylmaleimide is washed with acetone and dried.

30 g (0.184 mol) of potassium dimethylmaleimide are suspended in 175 g (1.89 mols) of epichlorohydrin. After adding 0.05 g of tetramethylammonium chloride, the mixture is heated, whilst stirring, and boiled under reflux for 18 hours and is then filtered. After removing the unconverted chlorohydrin by distillation under a waterpump vacuum, about 30 g of a viscous, pale brown liquid which has an epoxide content of 4.9 equivalents/kg (calculated: 5.5 equivalents/kg) remain. The NMR spectrum of the product corresponds to N-glycidyl-dimethylmaleimide of the formula

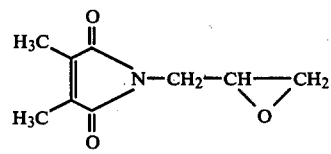

(A) Examples of polymers according to the invention which are formed by homopolymerisation or copolymerisation of monomers containing reactive C=C double bonds or which are manufactured using homopolymers or copolymers of this type as starting materials.

EXAMPLE 1

100 g of a copolymer of methyl vinyl ether and maleic anhydride (GANTREZ 119) (anhydride content 0.64 mol, $\eta = 5.76$ cP) and 121 g (0.66 mol) of N-(3-hydroxypropyl)-dimethylmaleimide are dissolved in 400 ml of dry tetrahydrofurane. 1 ml of concentrated sulphuric acid is then added. The reaction mixture is kept at 80° C. for 72 hours, whilst stirring. The homogeneous, colourless solution is then poured into 1 liter of ether or hexane. The rubbery precipitate is separated off, washed several times with ether and then dried in vacuo at 40° C. The mass can then be ground to a white powder.

Yield: 185 g (72% of theory) of polymer.

The course of the esterification can be followed easily by taking samples and examining these by IR spectroscopy. (Disappearance of the anhydride bands at wave numbers of 1780 and 1850 cm$^{-1}$ and appearance of the estercarboxylic acid bands at 1710 cm$^{-1}$).

In addition to Example 1, Table I also contains Examples 2 to 27, in which modified polymers are characterised. These polymers are obtained in the manner described in Example 1 by reacting the polymers in column 2 with the maleimide compounds in column 3. Column 4 gives the viscosity $\eta$ in centipoise, measured at 20° C. in an Ostwald viscometer, for a 2% strength solution in cyclohexanone.

Table I

| Example No. | Polymeric starting material | Maleimide compound (N— denotes [3,4-dimethyl-maleimide core]) | η |
|---|---|---|---|
| 1*) | [—CH—CH—CH₂—CH—]ₙ with anhydride (O=C-O-C=O) and O—CH₃ group | N—(CH₂)₃—OH | 12 |
| 2 | as Example 1 | " | |
| 3 | as Example 1 | | 7 |
| 4 | as Example 1 | N—(CH₂)₆—OH | 12 |
| 5*) | as Example 1 | N—(CH₂)₂—OH | |
| 6 | as Example 1 | " | 12 |
| 7*) | as Example 1 | N—[cyclohexyl]—OH | 6 |
| 8 | as Example 1 | " | 10 |
| 9 | as Example 1 | N—CH₂—CH(CH₃)—OH | 14 |
| 10 | as Example 1 | N—[cyclohexyl]—NH₂ | 16 |
| 11 | as Example 1 | N—NH₂ | 12 |
| 12 | as Example 1 | [tetrahydroisoindole-1,3-dione with H₃C substituent]—N—(CH₂)₃—OH | 12 |
| 13 | GANTREZ 139, η = 14 | [tetrahydroisoindole-1,3-dione]—N—(CH₂)₃—OH | 32 |
| 14 | as Example 13 | N—(CH₂)₃—OH | 30 |
| 15 | as Example 13 | N—(CH₂)₂—OH | 31 |
| 16 | as Example 13 | N—[cyclohexyl]—OH | 32 |
| 17 | EMA 11, η = 5; [—CH—CH—CH₂—CH₂—]ₙ with anhydride | N—(CH₂)₆—OH ; N—(CH₂—CH(CH₃)—OH) | 7 |

Table I-continued

Maleimide compound

N— denotes

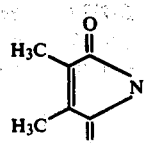

| Example No. | Polymeric starting material | | η |
|---|---|---|---|
| 18 | as Example 17 |  | 7 |
| 19 | as Example 17 | N—(CH₂)₃—OH  N—(CH₂)₂—OH | 7 |
| 20 | EMA 21 | 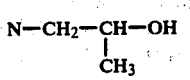 N—CH₂—CH—OH \| CH₃ | 18 |
| 21 | as Example 20 |  N—(CH₂)₃—OH | 20 |
| 22 | as Example 20 |  N—(CH₂)₂—OH | 18 |
| 23 | SMA (Arco Chemicals) 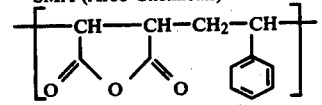 |  N—(CH₂)₂—OH | 30 |
| 24 | PA 6 (Gulf) 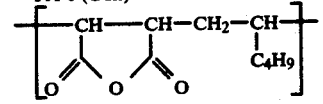 |  N—(CH₂)₂—OH | 15 |
| 25 | as Example 24 |  N—(CH₂)₃—OH | 16 |
| 26 | PA 10 (Gulf) 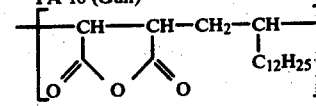 |  N—(CH₂)₂—OH | 20 |
| 27 | PA 14 (Gulf) 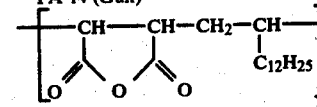 |  N—(CH₂)₂—OH | 20 |
| 28 | PA 18 (Gulf) 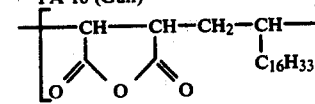 |  N—(CH₂)₂—OH | 28 |

*) In the case of the reaction products of Examples 2, 3, 4, 6 and 8 to 28, the half-ester is formed to the extent of 60 to 80% and in the case of the products of Examples 1, 5 and 7 it is formed to the extent of about 20 to 30%, based on the anhydride groups.

×) In the case of the reaction products of Examples 2, 3, 4, 6 and 8 to 28, the half-ester is formed to the extent of 60 to 80% and in the case of the products of Examples 1, 5 and 7 it is formed to the extent of about 20 to 30%, based on the anhydride groups.

The products of Examples 11 and 12 were prepared by the following methods.

EXAMPLE 11

7.8 g of GANTREZ 119 and 11.5 g of N-3-hydroxypropyl-3-methyl-cyclohex-1-ene-1,2-dicarboxylic acid imide are dissolved in 50 ml of dry tetrahydrofurane. The reaction mixture is kept at 80° C. for 7 hours, whilst stirring. After cooling, the clear solution is poured into 50 ccs of hexane, whilst stirring vigorously. The product, which is isolated by filtration, is dried and then powdered.

Yield: 13 g (67% of theory)

EXAMPLE 12

The conditions were the same as for No. 11; quantities: 14. g of GANTREZ 119 and 19.5 g of N-3-hydroxypropyl-cyclohex-1-ene-1,2-dicarboxylic acid imide dissolved in 100 ml of tetrahydrofurane. The product was precipitated with 200 ml of hexane.

Yield: 21.4 g (64% of theory).

EXAMPLE 29

1 g of a polyvinyl alcohol (MOVIOL 4-98) (0.0227 mol of HO groups) is dissolved, at 140 to 150° C., in 10 ml of dry dimethylformamide. 6.15 g of o-dimethylmaleimidylphthalic anhydride of the formula

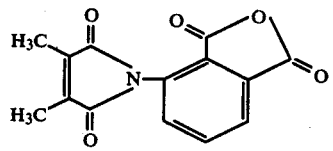

dissolved in 5 ml of dimethylformamide and 0.1 ml of dry pyridine, are then added. After the mixture has been treated for 24 hours at 140° to 150° C., it is cooled and 50 ml of ether are added and the resulting white, rubbery precipitate is separated off, rinsed with ether and dried. 7 g (100% of theory) of the reaction product are obtained.

Dry N-methylpyrrolidone is also a very advantageous solvent for this reaction. The degree of esterification can be adjusted easily by means of the quantity of anhydride which is added, so that, for example, 100% esterification or only 20% esterification takes place.

EXAMPLE 34

0.6 g of polyvinyl alcohol is dissolved in 20 ml of dry dimethylformamide at 140° C. 20 mg of 1,4-diazabicyclo[2.2.2]octane and 1 g of dry triethylamine are then added. 1.5 g of 6-dimethylmaleimidyl-caproic acid chloride in 5 ml of dry dimethylformamide are added slowly to this homogeneous solution and the reaction mixture is kept at 80° C. for 6 hours. After cooling, the triethylammonium chloride which has formed is filtered off and the polymer is precipitated with ether. After drying, 1 g of a white substance ramains. Dry N-methylpyrrolidone can also be used as the reaction medium.

TABLE II

Maleimide compound

N— denotes

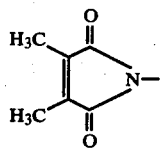

| Ex. No. | Polymeric starting material | |
|---|---|---|
| 29 | Polyvinyl alcohol MOVIOL 4-98 (Hoechst) | 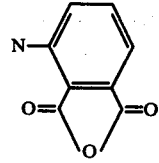 |
| 30* | as Example 29 | " |
| 31 | Polyvinyl alcohol MOVIOL 20-98 | as Examples 29 and 30 |
| 32 | Polyvinyl alcohol MOVIOL 4-88 | as Examples 29 and 30 |
| 33 | as Examples 29 and 30 | 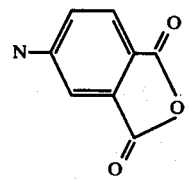 |
| 34 | as Example 32 | 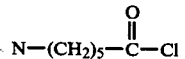 |
| 35 | as Examples 29 and 30 | 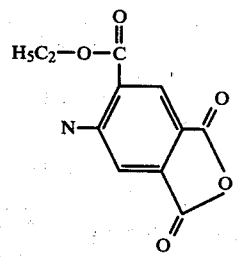 |

TABLE II-continued

Maleimide compound

N— denotes

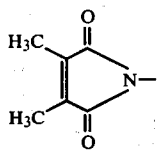

| Ex. No. | Polymeric starting material |
|---|---|
| 36 | as Examples 29 and 30 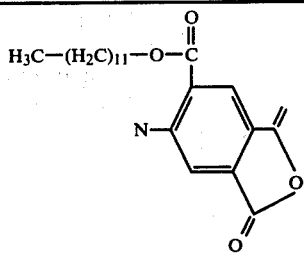 |

In the case of the reaction products of Examples 20 and 31 to 36, the half-ester is formed to the extent of 100% but in the case of Example 30, it is formed to the extent of only about 20%, based on the hydroxyl group.

EXAMPLE 37

40 g (0.16 mol) of the dimethylmaleimidyl derivative Z I (manufacturing instructions o), together with 0.1 g of α,β'-azo-bis-isobutyronitrile (azoisobutyronitrile), are dissolved in 260 ml of tetrahydrofuran. This mixture is polymerised for 6 hours under continuous gentle reflux (about 80° C.), whilst stirring and continuously under a nitrogen atmosphere. When the reaction has ended, the mixture is cooled to room temperature and the polymer is precipitated by adding the reaction solution dropwise to 5 liters of hexane. 32 g (80% of theory) of polymer are obtained as a white powder.

$H^1$ NMR [chlorobenzene, TMS as the internal standard = 0]: 1.96 ppm (6H), methyl protons of the dimethylmaleimide radical.

$\eta$inherent: 0.18 (measured in dimethylformamide at 20° C. in a 0.5% strength solution).

EXAMPLE 38

30 g (0.12 mol) of the dimethylmaleimidyl derivative Z I, together with 20 g (0.23 mol) of vinyl acetate and 0.4 g of azoisobutyronitrile are dissolved in 500 ml of ethyl acetate. This mixture is polymerised for 4 hours at 70° C., whilst stirring and continuously under a nitrogen atmosphere. When the reaction has ended, the mixture is cooled to room temperature and the polymer is precipitated by adding the reaction solution dropwise to 6 liters of hexane. 42 g (84% of theory) of polymer are obtained.

NMR: 1.98; $\eta$: 0.08.

EXAMPLE 39

30 g (0.12 mol) of the dimethylmaleimidyl derivative Z I, together with 55 g (0.55 mol) of methacrylic acid methyl ester, 15 g (0.15 mol) of acrylic acid ethyl ester and 0.4 g of azoisobutyronitrile, are dissolved in 500 ml of toluene. This mixture is polymerised for 8 hours at 70° C., whilst stirring and continuously under a nitrogen atmosphere. When the reaction has ended, the mixture is cooled to room temperature and the polymer is precipitated by adding the reaction solution dropwise to 6 liters of hexane. 85 g (85% of theory) of polymer are obtained.

NMR: 1.96; $\eta$: 0.18.

EXAMPLE 40

40 g (0.15 mol) of the dimethylmaleimidyl derivative Z II (manufacturing instructions o), together with 0.3 g of azoisobutyronitrile, are dissolved in 260 ml of tetrahydrofurane. This mixture is polymerised for 5 hours under continuous gentle reflux (about 80° C.), whilst stirring and continuously under a nitrogen atmosphere. When the reaction has ended, the mixture is cooled to room temperature and the polymer is precipitated by adding the reaction solution dropwise to 5 liters of hexane. 29 g (72% of theory) of polymer are obtained.

NMR: 1.96; $\eta$ 0.18.

EXAMPLE 41

102.75 g (0.40 mol) of the dimethylmaleimidyl derivative Z II, together with 75 g (0.75 mol) of methacrylic acid methyl ester and 0.85 g of azoisobutyronitrile, are dissolved in 800 ml of tetrahydrofurane. This mixture is polymerised for 6 hours under continuous gentle reflux (about 80° C.), whilst stirring and continuously under a nitrogen atmosphere. When the reaction has ended, the mixture is cooled to room temperature and the polymer is precipitated by adding the reaction solution dropwise to 8 liters of hexane. 124 g (70% of theory) of polymer are obtained.

NMR: 1.96; $\eta$: 0.05

EXAMPLE 42

100 g (0.39 mol) of the dimethylmaleimidyl derivative Z II, together with 30 g (0.21 mol) of methacrylic acid glycidyl ester, 10 g (0.07 mol) of methacrylic acid 2-hydroxyethyl ester, 10 g (0.05 mol) of acrylic acid 2-ethylhexyl ester and 1.5 g of benzoyl peroxide, are dissolved in 850 ml of tetrahydrofurane. This mixture is polymerised for 3 hours under continuous gentle reflux. When the reaction has ended, the mixture is cooled to room temperature and the polymer is precipitated by adding the reaction solution dropwise to 6 liters of hexane. 113 g (75% of theory) of polymer are obtained.

NMR: 1.98; $\eta$: 0.17.

EXAMPLE 43

20 g (0.07 mol) of the dimethylmaleimidyl derivative Z II, together with 10 g (0.09 mol) of 4-vinylpyridine and 0.3 g of azoisobutyronitrile, are dissolved in 250 ml of tetrahydrofurane. This mixture is polymerised for 3 hours under continuous gentle reflux (about 80° C.), whilst stirring and continuously under a nitrogen atmosphere. When the reaction has ended, the mixture is cooled to room temperature and the polymer is precipitated by adding the reaction solution dropwise to 2 liters of hexane. 24.9 g (83% of theory) of polymer are obtained.

NMR: 1.94; $\eta$: 0.14.

EXAMPLE 44

70 g (0.27 mol) of the dimethylmaleimidyl derivative Z II, together with 11 g (0.11 mol) of methacrylic acid methyl ester, 14 g (0.16 mol) of acrylic acid ethyl ester, 5 g (0.03 mol) of methacrylic acid 2-hydroxyethyl ester and 0.4 g of azoisobutyronitrile, are dissolved in 500 ml of dimethylformamide. This mixture is polymerised for 10 hours at 75° C., whilst stirring and continuously under a nitrogen atmosphere. When the reaction has ended, the mixture is cooled to room temperature and the polymer is precipitated by adding the reaction solution dropwise to 5 liters of water. 78 g (78% of theory) of polymer are obtained.

NMR: 1.96; $\eta$: 0.15.

EXAMPLE 45

70 g (0.27 mol) of the dimethylmaleimidyl derivative Z II, together with 25 g (0.29 mol) of acrylic acid ethyl ester, 5 g (0.03 mol) of methyacrylic acid 2-hydroxyethyl ester and 1 g of benzoyl peroxide, are dissolved in 500 ml of tetrahydrofurane. This mixture is polymerised for 5 hours under gentle reflux (about 80° C.), whilst stirring and continuously under a nitrogen atmosphere. When the reaction has ended, the mixture is cooled to room temperature and the polymer is precipitated by adding the reaction solution dropwise to 4 liters of hexane. 67 g (67% of theory) of polymer are obtained.

NMR: 1.96 $\eta$: 0.20.

EXAMPLE 46

25 g (0.1 mol) of the dimethylmaleimidyl derivative Z III (manufacturing instructions o), together with 0.2 g of azoisobutyronitrile, are dissolved in 250 ml of tetrahydrofurane. This mixture is polymerised for 5 hours under gentle reflux (about 80° C.), whilst stirring and continuously under a nitrogen atmosphere. When the reaction has ended, the mixture is cooled to room temperature and the polymer is precipitated by adding the reaction solution dropwise to 2 liters of hexane. 18 g (72% of theory) of polymer are obtained.

NMR: 1.98 ppm; $\eta$0.08.

EXAMPLE 47

71.5 g (0.24 mol) of the dimethylmaleimidyl derivative Z IV (manufacturing instructions o), together with 0.6 g of azoisobutyronitrile, are dissolved in 460 ml of tetrahydrofurane. This mixture is polymerised for 5 hours under gentle reflux (about 80° C.), whilst stirring and continuously under a nitrogen atmosphere. When the reaction has ended, the mixture is cooled to room temperature and the polymer is precipitated by adding the reaction solution dropwise to 5 liters of hexane. 61 g (85% of theory) of polymer are obtained.

NMR: 1.92 $\eta$: 0.21.

EXAMPLE 48

20 g (0.07 mol) of the dimethylmaleimidyl derivative Z V (manufacturing instructions o), together with 27.5 g (0.27 mol) of methacrylic acid methyl ester, 2.5 g (0.01 mol) of methacrylic acid 2-hydroxyethyl ester and 0.8 g of azoisobutyronitrile, are dissolved in 400 ml of toluene. This mixture is polymerised for 5 hours at 75° C., whilst stirring and continuously under a nitrogen atmosphere. When the reaction has ended, the mixture is cooled to room temperature and the polymer is precipitated by adding the reaction solution dropwise to 4 liters of hexane. 36 g (72% of theory) of polymer are obtained.

NMR: 1.95; $\eta$: 0.11.

EXAMPLE 49

137.4 g (0.34 mol) of the dimethylmaleimidyl derivative Z VI (manufacturing instructions r), together with 0.8 g of azoisobutyronitrile, are dissolved in 625 ml of tetrahydrofurane. This mixture is polymerised for 5 hours under gentle reflux (about 80° C.), whilst stirring and continuously under a nitrogen atmosphere. When the reaction has ended, the mixture is cooled to room temperature and the polymer is precipitated by adding the reaction solution dropwise to 5 liters of hexane. 120.7 g (88% of theory) of polymer are obtained. See the table for the chemical and physical data.

NMR: 1.96 $\eta$: 0.12.

EXAMPLE 50 40.1 g (0.1 mol) of the dimethylmaleimidyl derivative Z VI, together with 30 g (0.3 mol) of methacrylic acid methyl ester, 5.0 g (0.03 mol) of methacrylic acid 2-hydroxyethyl ester and 0.6 g of azoisobutyronitrile, are dissolved in 340 ml of tetrahydrofurane. The mixture is polymerised under gentle reflux (about 80°

C.), whilst stirring and continuously under a nitrogen atmosphere. When the reaction has ended, the mixture is cooled to room temperature. 71.9 g (95% of theory) of polymer are obtained.

NMR: 1.98; $\eta$: 0.14.

EXAMPLE 51

14.4 g (0.02 mol) of the dimethylmaleimidyl derivative Z VII (manufacturing instructions r), together with 20 g (0.2 mol) of methacrylic acid methyl ester, 10 g (0.07 mol) of methacrylic acid 2-hydroxyethyl ester and 0.4 g of azoisobutyronitrile, are dissolved in 270 ml of tetrahydrofurane. This mixture is polymerised under gentle reflux (about 80° C.), whilst stirring and continuously under a nitrogen atmosphere. When the reaction has ended (reaction time about 7 hours), the mixture is cooled to room temperature and the polymer is precipitated by adding the reaction solution dropwise to 2 liters of hexane. 27 g (60% of theory) of polymer are obtained.

NMR: 1.94; $\eta$: 0.19.

EXAMPLE 52

40 g (0.18 mol) of N-(N-maleimidyl)-dimethylmaleimide of the formula

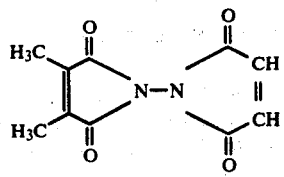

together with 18.1 g (0.18 mol) of styrene and 0.23 g of azoisobutyronitrile, are dissolved in 374 ml of benzene. This mixture is polymerised for 4 hours under gentle reflux (about 80° C.), whilst stirring and continuously under a nitrogen atmosphere. When the reaction has ended, the mixture is cooled to room temperature and the polymer is precipitated by adding the reaction solution dropwise to 3 liters of hexane. 37.2 (77% of theory) of polymer are obtained.

NMR: 1.98 ppm; η: 0.72.

EXAMPLE 53

16.2 g (0.07 mol) of the dimethylmaleimidyl derivative Z IX (manufacturing instructions q), together with 30 g (0.3 mol) of methacrylic acid methyl ester and 0.4 g of azoisobutyronitrile, are dissolved in 270 ml of tetrahydrofurane. This mixture is polymerised for about 6 hours under gentle reflux (about 80° C.), whilst stirring and continuously under a nitrogen atmosphere. When the reaction has ended, the mixture is cooled to room temperature and the polymer is precipitated by adding the reaction solution dropwise to 2 liters of hexane. 32 g (69% of theory) of polymer are obtained.

NMR: 1.97; η: 0.05.

EXAMPLE 54

13 g (0.1 mol) of the dimethylmaleimidyl derivative of the formula

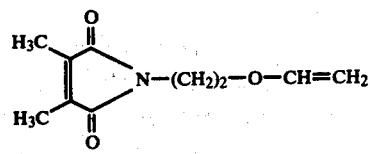

together with 26 g (0.26 mol) of methacrylic acid methyl ester and 0.2 g of azoisobutyronitrile, are dissolved in 390 ml of tetrahydrofurane. This mixture is polymerised for 6 hours under gentle reflux (about 80° C.), whilst stirring and continuously under a nitrogen atmosphere. When the reaction has ended, the mixture is cooled to room temperature and the polymer is precipitated by adding the reaction solution dropwise to 4 liters of hexane. 30 g (76% of theory) of polymer are obtained.

NMR: 1.94; η: 0.31.

EXAMPLE 55

6.0 g (19 mmols) of the maleimidyl derivative Z XI (manufacturing instructions o), together with 0.06 g of azoisobutyronitrile, are dissolved in 40 ml of tetrahydrofurane. This mixture is polymerised for 4 hours under gentle reflux, whilst stirring and continuously under a nitrogen atmosphere. When the reaction has ended, the mixture is cooled to room temperature and the polymer is precipitated by adding the reaction solution dropwise to 500 ml of hexane.

5.8 g (96% of theory) of polymer are obtained.

NMR: η: 0.18

EXAMPLE 56

100 g (0.24 mol) of the dimethylmaleimidyl derivative Z VI (manufacturing instructions r), together with 2.2 g of dodecylmercaptan and 1.8 of azoisobutyronitrile, are dissolved in 200 g (2 mols) of methacrylic acid methyl ester.

This solution is suspended in a mixture of 600 ml of water and 1.8 g of MOWIOL N-88 (polyvinyl alcohol). This suspension is polymerised for 6 hours at 70° C., whilst stirring and continuously under a nitrogen atmosphere. When the reaction has ended, the mixture is cooled to room temperature and the resulting polymer (in the form of fine beads) is separated off by means of filtration. The polymer is washed several times with water and then dried in vacuo at 40° C. 233 g (77% of theory) of polymer are obtained.

EXAMPLE 57

142.2 g (0.06 mol) of N-[5-methyl-3-oxa-4-oxo-hex-5-enyl]dimethylmaleimide (ZI), 36.8 g (0.2 mol) of acrylic acid 2-ethylhexyl ester, 34.2 g (0.2 mol) of acrylic acid diethylaminoethyl ester, 2.13 g (1% by weight, based on the weight of monomer) of azoisobutyronitrile and 518 ml of glycol monoethyl ether-acetate are initially introduced, under a nitrogen atmosphere, into a reaction vessel in which the temperature can be controlled by means of a thermostat.

The mixture was then heated to 80° C. and stirred at this temperature for about 8 hours. (Stirring speed = 250 revolutions/minute). After cooling, it was possible, after adding the desired sensitiser, to use the resulting polymer solution direct in order to produce photo-sensitive layers.

EXAMPLE 58

189.5 g (0.8 mol) of N-[5-methyl-3-oxa-4-oxo-hex-5-enyl]-dimethylmaleimide, 34.2 g (0.2 mol) of acrylic acid diethylaminoethyl ester, 2.24 g (1% by weight, based on the weight of monomer) of azoisobutyronitrile and 700 ml of glycol monoethyl ether-acetate were initially introduced, under a nitrogen atmosphere, into a reaction vessel in which the temperature can be controlled by means of a thermostat.

The mixture was then heated to 80° C. and stirred at this temperature for about 8 hours (stirring speed = 250 revolutions/minute).

After cooling, it was possible, after adding the desired sensitiser, to use the resulting polymer solution direct in order to produce photo-sensitive layers.

EXAMPLE 59

118.5 g (0.5 mol) of N-[5-methyl-3-oxa-4-oxo-hex-5-enyl]-dimethylmaleimide (ZI), 30.0 g (0.3 mol) of acrylic acid ethyl ester, 20.0 g (0.2 mol) of methacrylic acid methyl ester, 1.68 g (1% by weight, based on the weight of monomer) of azoisobutyronitrile and 525 ml of glycol monoethyl ether-acetate were initially introduced, under a nitrogen atmosphere, into a reaction vessel in which the temperature can be controlled by means of a thermostat.

The mixture was then heated to 80° C. and stirred at this temperature for about 8 hours (stirring speed = 250 revolutions/minute).

After cooling, it was possible, after adding the desired sensitiser, to use the resulting polymer solution direct in order to produce photo-sensitive layers.

EXAMPLE 60

130.5 g (0.55 mol) of N-[5-methyl-3-oxa-4-oxo-hex-5-enyl]-dimethylmaleimide (ZI), 21.6 g (0.3 mol) of acrylic acid, 15.0 g (0.15 mol) of acrylic acid ester, 1.67 g (1% by weight, based on the weight of monomer) of azoisobutyronitrile and 570 ml of tetrahydrofurane were mixed, under nitrogen, in a reaction vessel in which the temperature can be controlled by means of a thermostat.

The mixture was then heated to 80° C. and stirred at this temperature of about 8 hours (stirring speed = 250 revolutions/minute).

After cooling to room temperature, the polymer solution was diluted with 600 ml of tetrahydrofurane and then added to 1.5 l of hexane in order to precipiate the polymer.

Yield = 104.5 g = 84.2% of theory.

EXAMPLE 61

78.2 g (0.33 mol) of N-[5-methyl-3-oxa-4-oxo-hex-5-enyl]-dimethylmaleimide, 61.6 g (0.36 mol) of acrylic acid diethylaminoethyl ester, 21.6 g (0.30 mol) of acrylic acid and 1.61 g (1% by weight, based on the weight of monomer) of azoisobutyronitrile are dissolved, under nitrogen, in 734 ml of tetrahydrofurane in a reaction vessel in which the temperature can be controlled by means of a thermostat and the solution is then heated to 80° C.

The solution is stirred for 8 hours under these conditions (stirring speed = 250 revolutions/minute).

After cooling, the resulting polymer solution is added to 1.5 l of hexane in order to precipitate the polymer. After filtering, the precipitate was dried in vacuo at 40° C.

Yield: 85.1 g = 50% of theory; $\eta$inherent = 0.25.

The polymer is soluble in water.

EXAMPLE 62

78.2 g (0.33 mol) of N-[5-methyl-3-oxa-4-oxo-hex-5-enyl]-dimethylmaleimide, 36.6 g (0.33 mol) of vinylpyrrolidone, 23.8 g (0.33 mol) of acrylic acid and 1.30 g (1% by weight, based on the weight of monomer) of azoisobutyronitrile are dissolved, under nitrogen, in 734 ml of tetrahydrofurane in a reaction vessel in which the temperature can be controlled by means of a thermostat and the solution is then heated to 80° C.

The solution is stirred for 8 hours under these conditions (stirring speed = 250 revolutions/minute).

After cooling, the resulting polymer solution is added to 1.5 l of hexane in order to precipitate the polymer. After filtering, the precipitate is dried in vacuo at 40° C.

Yield: 94.2 g = 72.5% of theory, $\eta$inherent = 0.22.

The polymer is soluble in a 5% strength aqueous solution of sodium bicarbonate.

EXAMPLE 63

A mixture of 6.18 g of a styrene/glycidyl methacrylate copolymer which has an epoxide content of 4.0 equivalents per kg and an average molecular weight of 3,100, 6.09 g of N-(p-carboxyphenyl)-dimethylmaleimide (manufacturing instructions b), 0.02 g of hydroquinone, 0.03 g of tetramethylammonium chloride and 24 g of cyclohexanone is kept at 120°C. for 1¾ hours, after which the epoxide content (based on the solids content of the solution) is still 0.3 equivalent/kg.

EXAMPLE 64

A mixture of 4.8 g of the copolymer mentioned at the start of Example 63, 3.5 g of N-(carboxymethyl)-dimethylmaleimide, 0.01 g of hydroquinone, 0.03 g of tetramethylammonium chloride and 15 g of cyclohexanone is kept at 120° C. for 25 minutes and during this period the epoxide content falls to 0.14 equivalent/kg.

EXAMPLE 65

A mixture of 5 g of a styrene/maleic anhydride copolymer (styrene to anhydride ratio equals 1:1, average molecular weight 1,600), 6.5 g of N-(3-hydroxypropyl)-dimethylmaleimide, 0.02 g of N-benzyl-dimethylamine, 0.02 g of hydroquinone and 20 g of cyclohexanone is kept at 120° C. for 5 hours. After this period it is no longer possible to detect any significant amount of anhydride when the infrared spectrum is examined.

EXAMPLE 66

2.2 g of a polyvinyl alcohol which has an average molecular weight of 14,000 and a residual acetate content of less than 3% (GELVATOL 1-30 from the Monsanto Company) are dissolved in 40 ml of pyridine by stirring at 50° C. for 3 hours. After adding 9 g of p-(dimethylmaleimido)benzoyl chloride, the mixture is stirred for a further 3 hours, then cooled and poured into 150 ml of water and the precipitate which is thus formed is filtered off. This residue is dissolved in 20 ml of cyclohexane.

EXAMPLE 67

A mixture of 4.26 g of the styrene/glycidyl methacrylate copolymer of the composition indicated in Example 63, 3.0 g of N-(3-hydroxypropyl)-dimethylmaleimide and 15 g of cyclohexanone is stirred at 120° C. for 3½ hours, during which time the epoxide content falls to 1.0 equivalent/kg.

(B) Examples of polymers according to the invention of the polyamide and polyamide-imide type

EXAMPLE 68

Preparation of a 90:10 acid chloride mixture: 40.20 g of isophthaloyl chloride and 7.17 g of 5-dimethylmaleimidoisophthaloyl chloride (manufacturing instructions i) are melted together at 70° C., the melt is allowed to solidify and the solid is crumbled.

Condensation reaction: 21.47 g of m-phenylenediamine are dissolved in 190 ml of dimethylacetamide, the solution is cooled to −25° C. and 43.07 g of the 90:10 acid chloride mixture in the solid form are added all at once, whilst stirring well and blanketing with an inert gas, and the temperature then rises to about +30° C. The cooling bath is removed and the reaction product is stirred for 3 hours at room temperature. After diluting with dimethylacetamide (190 ml), the polymer is precipitated with water, whilst stirring vigorously, washed with water until neutral and dried overnight in a vacuum drying cabinet at 120° C. A fibrous, almost white polymer which has a viscosity $\eta$intrinsic = 0.7 dl/g (0.5% weight/volume in dimethylacetamide), is soluble in dimethylformamide or dimethylacetamide without the addition of a salt and can be processed to give films, which after irradiation with UV light are insoluble and therefore crosslinked, is obtained in quantitative yield.

EXAMPLE 69

70:30 acid chloride mixture: the acid chloride mixture is prepared, in the manner described in Example 68, from 31.27 g of isophthaloyl chloride and 21.53 g of 5-dimethylmaleimidoisophthaloyl chloride.

A polymer which has an intrinsic viscosity of 0.6 dl/g (0.5% strength in dimethylacetamide) is prepared, by the process of Example 68, from 21.47 g of m-phenylenediamine in 190 ml of dimethylacetamide and 48.00 g of the 70:30 acid chloride mixture. Clear transparent films, which can be crosslinked photochemically, are formed from the solution in dimethylacetamide.

EXAMPLE 70

19.69 g (0.0993 mol) of diaminodiphenylmethane are dissolved in 150 ml of dry dimethylacetamide and the solution is cooled to $-20°$ C. under nitrogen. 16.74 g (0.07 mol) of sebacic acid dichloride are allowed to run in dropwise at a temperature of $-10°$ to $-20°$ C., whilst stirring, and 9.78 g (0.03 mol) of 5-dimethylmaleimido-isophthaloyl chloride are then added all at once. The cooling bath is removed and the mixture is stirred for 3 hours at room temperature. The highly viscous yellowish reaction product is precipitated in water, whilst stirring intensively, washed until neutral and dried in vacuo at 80° C. for 24 hours. A yellowish fibrous polymer which has an intrinsic viscosity $\eta_{intrinsic}$ of 0.81 dl/g (0.5% strength in concentrated sulphuric acid), is soluble in dimethylacetamide plus 5% of lithium chloride and gives transparent films, is obtained in quantitative yield.

EXAMPLE 71

34.20 g (0.298 mol) of trans-2,5-dimethylpiperazine and 84.0 ml of triethylamine are dissolved in 500 ml of dry chloroform. A solution of 50.25 g (0.210 mol) of sebacic acid dichloride and 29.35 g (0.090 mol) of 5-dimethylmaleimido-isophthaloyl chloride in 400 ml of chloroform is allowed to run dropwise into this solution at a temperature of $-5°$ C., whilst stirring. The dropping funnel rinsed out with 100 ml of chloroform and the reaction mixture is stirred for 1 hour at room temperature without a cooling bath. The viscous solution is precipitated in 2,500 ml of petroleum ether and the fibrous polymer is freed from triethylammonium chloride by washing several times with warm water and dried in vacuo at 80° C. for 24 hours. A colourless polymeric product which has an intrinsic viscosity $\eta_{intrinsic}$ of 1.37 dl/g (0.5% strength in concentrated sulphuric acid), is soluble in chlorinated hydrocarbons, such as chloroform, methylene chloride and 1,2-dichloroethane, and forms tough transparent films, is obtained in quantitative yield.

EXAMPLE 72

38.446 g (0.192 mol) of 4,4'-diamino-diphenyl ether are dissolved in 200 ml of absolute N,N-dimethylacetamide under nitrogen in a stirred apparatus. The solution is cooled to $-15°$ C. and an intimate mixture of 15.0 g (0.048 mol) of 5-dimethylmaleimidylbenzene-1,2-(carboxylic acid anhydride)-4-carboxylic acid chloride and 30.322 g (0.144 mol) of benzene-1,2-(dicarboxylic acid anhydride)-4-carboxylic acid chloride is sprinkled in, whilst stirring vigorously, at $-15°$ C. to $-5°$ C. A slightly exothermic reaction takes place and a viscous solution forms and is diluted with 100 ml of N,N-dimethylacetamide and gradually warmed to room temperature. Any insoluble constituents which may be present go into solution. After stirring for 2 hours at room temperature a further 100 ml of N,N-dimethylacetamide are added and the hydrochloric acid formed during the reaction is precipitated with 19.42 g (0.192 mol) of triethylamine. The salt which has precipitated out is filtered off. The polymer has an intrinsic viscosity $\eta$ of 0.65 dl/g (0.5% strength clear solution in N,N-dimethylacetamide at 25° C.).

The solution is suitable, optionally after the addition of 1% of thioxanthone, for casting films and sheets which can be crosslinked photochemically and which are obtained in a known manner by evaporating the solvent and cyclising the amide-acids to the imide at elevated temperature in vacuo. The uncrosslinked cyclised polymer is soluble in N,N-dimethylformamide, N,N-dimethylacetamide, N-methylpyrrolidone and concentrated sulphuric acid.

(C) Examples of polymers according to the invention which are of pure polyester character

EXAMPLE 73

97.0 g (0.5 mol) of dimethyl terephthalate, 55.8 g (0.9 mol) of ethylene glycol and 0.04 g of zinc acetate dihydrate were melted together at 150° C. under nitrogen.

The temperature was now raised to 230° C. in the course of about 3 hours, during which time the methanol formed distilled off. After 1 hour at 230° C., the temperature of the melt was raised to 270° C. and, at the same time, 0.05 g of triphenyl phosphite, 0.05 g of antimony trioxide and 0.3 g of 2,6-di-tert.-butyl-p-cresol were added.

The pressure was now reduced slowly to 14 mm Hg and the mixture was subjected to polycondensation under this pressure for 20 minutes. The polycondensation reaction was then discontinued by admitting nitrogen to the system and 11.6 g (0.0263 mol) of dimethylmaleimidoisophthalic acid diphenyl ester were added. The temperature was then lowered immediately to 260° C. and a vacuum of 0.1 mm Hg was applied to the reaction vessel.

The polycondensation reaction was discontinued after 1.5 hours under these conditions.

EXAMPLE 74

97.0 g (0.5 mol) of dimethyl terephthalate, 55.8 g (0.9 mol) of ethylene glycol and 0.04 g of zinc acetate dihydrate were melted together at 150° C. under nitrogen.

The temperature was now raised to 230° C. in the course of about 3 hours, during which time the methanol formed distilled off. After 1 hour at 230° C., the temperature of the melt was raised to 270° C. and, at the same time, 0.05 g of triphenyl phosphite, 0.05 g of antimony trioxide and 0.3 g of 2,6-di-tert.-butyl-p-cresol were added.

The pressure was now slowly lowered to 14 mm Hg and the mixture was subjected to polycondensation for 10 minutes under this pressure. The polycondensation reaction was then discontinued by admitting nitrogen to the system and 24.5 g (0.0555 mol) of dimethylmaleimidoisophthalic acid diphenyl ester were added. The temperature was then lowered immediately to 260° C. and a vacuum of 0.1 mm Hg was applied to the reaction vessel.

The polycondensation reaction was discontinued after 1.5 hours under these conditions.

EXAMPLE 75

97.0 g (0.5 mol) of dimethyl terephthalate, 55.8 g (0.9 mol) of ethylene glycol and 0.04 g of zinc acetate dihydrate were melted together at 150° C. under nitrogen.

The temperature was now raised to 230° C. in the course of about 3 hours, during which time the methanol formed distilled off. After 1 hour at 230° C., the temperature of the melt was raised to 270° C. and, at the same time, 0.05 g of triphenyl phosphite, 0.05 g of antimony trioxide, 0.3 g of 2,6-di-tert.-butyl-p-cresol and 55.1 g (0.125 mol) of dimethylmaleimidoisophthalic acid diphenyl ester were added. The temperature was now lowered immediately to 260° C. and a vacuum of 0.1 mm Hg was applied to the reaction vessel. The polycondensation reaction was discontinued after 1.5 hours under these conditions.

(D) Examples of polymers, according to the invention, of the polyester type, which are formed by reacting monomeric compounds containing epoxide groups with monomeric compounds containing carboxyl groups or dicarboxylic acid anhydride groups

EXAMPLE 76

A mixture of 5.0 g of butane-1,4-diol diglycidyl ether, 6.9 g of N-(3,5-dicarboxyphenyl)-dimethylmaleimide, 0.02 g of hydroquinone, 0.02 g of tetramethylammonium chloride and 24 g of cyclohexanone is kept at 120° C. for 2 hours. After this time the epoxide content is still about 0.4 equivalent/kg.

EXAMPLE 77

A mixture of 2.53 g of 1,3-diglycidyl-5,5'-dimethylhydantoin, 5 g of N-(p-carboxyphenyl)-dimethylmaleimide, 0.02 g of hydroquinone, 0.02 g of tetramethylammonium chloride and 25 g of cyclohexanone is stirred at 120° C. for 1½ hours, after which the epoxide content is still 0.4 equivalent/kg. 3.15 g of benzophenonetetracarboxylic acid dianhydride are then added and the mixture is stirred at 120° C. for 3 hours. After this time the anhydride content of the solution has fallen to about 10% of the original value, as can be seen from the infrared spectrum.

EXAMPLE 78

A mixture of 5.0 g of N-glycidyldimethylmaleimide, 3.2 g of phthalic anhydride, 0.05 g of N-benzyldimethylamine and 20 g of cyclohexanone is stirred at 120° C. for 4 hours, after which the epoxide content is 0.28 equivalent/kg.

EXAMPLE 79

The procedure is as indicated in Example 78, but 2.1 g of succinic anhydride are used in place of phthalic anhydride and the mixture is kept under reflux for only 2 hours. The epoxide content falls to 0.45 equivalent/kg.

EXAMPLE 80(a)

A mixture of 2.50 g of N-(3,5-dicarboxyphenyl)-dimethylmaleimide, 2.15 g of 1,3-diglycidyl-5,5-dimethylhydantoin, 0.02 g of dimethylformamide and 15 g of 2-ethoxyethanol is stirred at 120° C. for 2 hours, after which the epoxide content of the product is still about 0.34 equivalent/kg.

EXAMPLE 80(b)

A mixture of 3 g of N-glycidyl-dimethylmaleimide, 1.7 g of pentaerythritol tetrakis-(3-mercaptopropionate), 0.05 g of tetramethylammonium chloride and 11 g of cyclohexanone was boiled at 120° C. for 2 hours. During this time the epoxide content of the product (relative to the original content of the starting materials) fell to 0.35 equivalent per kg. 0.1 g of thioxanthone was added to 4 g of this solution. After irradiation with UV light and developing in cyclohexanone, photo-sensitive plates coated with this solution gave good relief images.

(E) Examples of polymers, according to the invention, based on phenol-formaldehyde condensates (novolac derivatives)

EXAMPLE 81

A mixture of 10 g of an epoxy-novolac resin (a polyglycidyl ether with an epoxide content of 5.61 equivalents/kg obtained from a phenol-formaldehyde resin with an average molecular weight of 420), 5.45 g of N-(carboxymethyl)-dimethylmaleimide, 2.29 g of bisphenol A (di-2,2-(p-hydroxyphenyl)-propane), 0.02 g of hydroquinone, 0.05 g of tetramethylammonium chloride and 16 g of cyclohexanone is kept at 120° C. for 2¼ hours. After this time the mixture contains virtually no further epoxide.

EXAMPLE 82

A mixture of 4 g of the epoxy-novolac resin of the composition indicated in Example 81, 4.58 g of N-(p-carboxyphenyl)-dimethylmaleimide, 0.43 g of bisphenol A, 0.02 g of hydroquinone and 18 g of cyclohexanone is kept at 120° C. for 2 hours. After this time the epoxide content of the solid is still 0.38 equivalent/kg.

(F) Examples of polymers, according to the invention, of the polyethyleneimine type

EXAMPLE 83

2.8 g of p-(dimethylmaleimido)-benzoyl chloride are added to a solution of 3.0 g of a polyethyleneimine, which has an average molecular weight of 1,650 to 1,950 and a degree of branching which is determined by a ratio of primary to secondary to tertiary nitrogen atoms of approximately 1:2:1 (MONTREX PEI-18 from the Dow Chemical Company) in 30 ml of cyclohexanone, at room temperature, whilst stirring.

The mixture is stirred for one hour at 120° C. and, after cooling, is filtered. 0.1 g of benzophenone is added to 3 g of this solution and the mixture is tested as indicated in Example 28. After 10 minutes' exposure and developing in cyclohexanone, a good image is obtained.

EXAMPLE 84

A solution of 4 g of p-(dimethylmaleimido)-benzoyl chloride in 35 ml of cyclohexanone is added to a solution of 3.0 g of a polyethyleneimine which has an average molecular weight of 450 to 750 and chain branching in which the ratio of primary to secondary to tertiary nitrogen atoms is approximately 1:2:1 (MONTREK PEI-6, Dow Chemical Company) and of 1.54 g of triethylamine in 35 ml of cyclohexanone, whilst stirring, and the mixture is stirred for a further hour at 60° C. It is then cooled and filtered.

(G) Examples of polymers, according to the invention, based on polyethers (phenoxy resins)

EXAMPLES 85 and 86

10 g of the phenoxy resins PKHC or PKHH (Union Carbide) are dissolved in 100 ml of N-methylpyrrolidone (dry). 10 g of m-dimethylmaleimidyl-phthalic anhydride are added and the homogeneous reaction mixture is kept at 100° C. for 24 hours. The cooled solution is then poured into 500 ml of ether and the product which has precipitated out is filtered off. After drying, the product is in the form of a white mass which can be powdered easily.

Yield: 20 g (100% of theory)

IR: strong band at 1,710 cm$^{-1}$ (carbonyl and estercarbonyl frequency).

Table III shows the structures involved in Examples 85 to 86.

Table III

| Example No. | Polymeric starting material | Maleimide compound (N-denotes [dimethylmaleimide structure]) |
|---|---|---|
| 85 | [Bisphenol A phenoxy structure with —O—CH$_2$—C(OH)—CH$_2$—] Phenoxy resin PKHC (Union Carbide) Molecular weight <30,000 | [N-aryl phthalic anhydride structure] |
| 86 | [Bisphenol A phenoxy structure with —O—CH$_2$—C(OH)—CH$_2$—] Phenoxy resin PKHH (Union Carbide) Molecular weight about 30,000 | as Example 85 |

In the case of the reaction products of Examples 85 and 86, the half-ester is formed to the extent of 100%, based on the hydroxyl groups.

(H) Examples relating to the photochemical use of the polymers according to the invention

EXAMPLE I

Benzophenone is added to the polymer solution obtained according to Example 63 in an amount such that the benzophenone content is 10%. The solution can be used as follows in order to produce a printed circuit:

A copper-coated laminate is coated with this solution and the solvent is allowed to evaporate so that a film about 10 μ thick remains. This film is exposed under a negative for 3 minutes using a 500 watt medium pressure mercury vapour lamp at a distance of 230 mm. The image is then developed by washing out the unpolymerised constituents, by mean of a wash with cyclohexanone, from the areas which were not exposed. The areas in which the copper has been bared are then etched with a solution which contains 60 parts of ferric chloride and 10 parts by weight of concentrated hydrochloric acid per 100 parts by weight, whereupon a good relief image is formed.

EXAMPLE II

If the solution obtained according to Example 64 is tested as indicated in Example I and exposure is for 15 minutes and developing is carried out in an acetone/toluene mixture (1:3 in parts by volume), a good image is obtained.

EXAMPLE III

A mixture of 0.45 g of benzophenone and 0.45 g of Michler's ketone is added to 9 g of the solution obtained according to Example 65 and the resulting solution is tested using the method described in Example I. After an exposure of 15 minutes and developing in chloroform/carbon tetrachloride (1:2 in parts by volume), good relief images are obtained.

EXAMPLE IV 0.9 g of benzophenone are added to 9 g of the solution obtained according to Example 76 and this mixture is tested as described in Example I. After an exposure of 15 minutes and developing in an acetone/toluene mixture (1:3 in parts by volume), an image is obtained.

EXAMPLE V 0.9 g of benzophenone are also added to 9 g of the solution obtained according to Example 77 and the mixture is tested as described in Example I. A good image is obtained after an exposure of 20 minutes and developing in a 5% strength aqueous solution of disodium hydrogen phosphate.

EXAMPLE VI 0.1 g of thioxanthone is added to 5 g of the solution obtained according to Example 78 and the mixture is tested as described in Example I. After an exposure of 15 minutes and developing in toluene, a relief image is obtained.

EXAMPLE VII 0.1 g of thioxanthone is added to 4 g of the solution obtained according to Example 79 and the procedure is then as in Example VI. An analogous relief image is obtained.

EXAMPLE VIII

A mixture of 0.45 g of benzophenone and 0.45 g of methyl benzoin ether is added to 9 g of the solution obtained according to Example 81 and the whole is tested as in Example I. After an exposure of 15 minutes and developing in an acetone/toluene mixture (1:3 in parts by volume), a good relief image is obtained.

EXAMPLE IX 0.1 g of thioxanthone is added to 4 g of the solution obtained according to Example 82 and the mixture is tested as in Example I. After an exposure of 15 minutes and developing in an acetone/toluene mixture (1:1 in parts by volume), a relief image is obtained.

EXAMPLE X 0.1 g of thioxanthone is added to 4 g of the solution obtained according to Example 80 and the mixture is tested as indicated in Example I. After an exposure of 15 minutes and subsequent developing in cyclohexanone, a relief image is obtained.

EXAMPLE XI 0.3 g of benzophenone is added to 9 g of the solution obtained according to Example 66 and the solution is tested by the method described in Example I. After an exposure of 15 minutes and developing in cyclohexanone, an image is obtained.

EXAMPLE XII

In order to carry out the test in accordance with the instructions of Example I, 0.9 g of benzophenone is added to 9 g of the solution obtained according to Example 67. After an exposure of 10 minutes and developing in cyclohexanone, good images are obtained.

EXAMPLE XIII

The polymers obtained according to Examples 63, 65 and 76 are tested by the method of Example I but, in each case, instead of benzophenone 0.1 g of thioxanthone is added to 4 g of the solution. Good relief images are obtained after 1 minute with the polymer of Example 63, after 4 to 15 minutes with the polymer of Example 65 and after 7 to 15 minutes with the polymer of Example 76. Thioxanthone thus displays an increased activity.

EXAMPLE XIV 0.3 g of benzophenone and 0.12 g of dicyandiamide are added to 6 g of 30% strength solution of the reaction product prepared according to Example 63. A copper-coated laminate is coated with this solution. After allowing the solvent to evaporate, a film about 20¾ thick remains. The film is exposed under a negative, and then developed in cyclohexanone, as described in Example I, and a good relief image is obtained on the copper. If this plate is kept at 180° C. for 2 hours, the polymer coating in the image areas displays very good adhesion to the copper and excellent resistance to solvents. None of the coating is removed when the customary acetone rubbing test is carried out, that is to say after rubbing twenty times with a pad of cotton wool soaked in acetone.

EXAMPLE XV

The present example relates to the manufacture of printed circuits from coated copper sheets. The circuits are manufactured according to the known manufacturing technique, as is described by Bogenschutz in "Fotolacktechnik" ("Photographic Lacquer Technique") Eugen G. Lenze-Verlag, DT 7968 Saulgau [1975], under the following conditions:

Exposure — 400 watt high pressure mercury lamp at a distance of 40 cm from the vacuum table Original — silver image of a circuit on a transparent polyester film Solvent —(for the polymer and for developing the exposed plate) cyclohexanone (CHE) or 1,1,1-trichloroethane (TE)

Concentration — 5 to 10% of polymer and 0.5% of thioxanthone in the coating solution Coating — whirler-coating at 3,000 revolutions per minute, then drying for 5 minutes at 40 to 50° C.

Developing — in the solvents mentioned, then drying for 5 minutes at 80° to 100° C.

Etching — in a 60% strength solution of ferric chloride

Copper laminates coated with the polymers of column 1 in Table IV which follows are exposed for the time indicated in column 2 and then treated with the developer according to column 3.

CHE denotes cyclohexanone and TE denotes 1,1,1-trichloroethane.

Table IV

| Polymer according to Example No. | Exposure (seconds) | Developer | Polymer according to Example No. | Exposure (seconds) | Developer |
| --- | --- | --- | --- | --- | --- |
| 1 | 5 | CHE | 86 | | |
| 10 | 20 | CHE | 37 | 40 | TE |
| 11 | 5 | TE | 38 | 20 | TE |
| 12 | 5 | CHE | 39 | 40 | TE |
| 13 | 10 | CHE | 40 | 20 | TE |
| 18 | 10 | CHE | 41 | 40 | TE |
| 19 | 10 | CHE | 43 | 40 | TE |
| 29 | 60 | CHE | 44 | 40 | TE |
| 31 | 60 | CHE | 45 | 40 | TE |
| 32 | 60 | CHE | 49 | 40 | TE |
| 33 | 60 | CHE | 51 | 60 | TE |
| 85 | 40 | TE | 52 | 40 | TE |

It is possible to achieve flawless etching using the exposure times indicated in column 2. All of the polymers crosslinked in the indicated manner display a good resistance to solvents. Storage for 24 hours in dimethylformamide or cyclohexanone leads to no impairment on etching. In addition, the crosslinked polymer on the copper surface is resistant to the etching solution for 12 to 24 hours.

EXAMPLE XVI

This example relates to images which are produced by photo-crosslinking of the polymers according to the invention and are rendered more readily visible by staining. The exposure is effected using a 400 watt high pressure mercury vapour lamp at a distance of 40 cm from the vacuum table. A twelve-step wedge with a sixty screen and a one hundred and twenty screen and a ten-step wedge with density differences of 0.21 serve as the original.

Solvent — for the polymer and also for developing the exposed plate: cyclohexanone or a 5% strength aqueous solution of sodium bicarbonate Coating — by whirler-coating at 2,000 to 3,000 revolutions per minute Developing — for 30 seconds in sodium bicarbonate solution The image-wise crosslinked polymer can then be stained easily using a cationic dyestuff, for example that of the formula

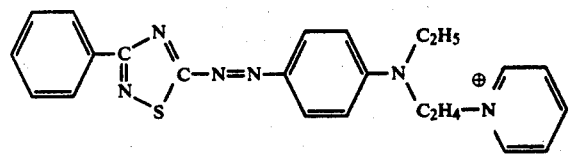

applied from aqueous solution and the image is rendered readily visible by this means.

Sensitising — the triplet energy of the sensitiser must be higher than 50 kcals/mol. The concentration of the sensitiser is 1%.

The results obtained with different polymers and sensitisers are summarised in Table V which follows. CHE denotes cyclohexanone.

to the invention and can be developed in organic solvents.

A solution consisting of 89 parts by weight of 1,1,1-trichloroethane, 10 parts by weight of the polymer of Example No. 45 and 1 part by weight of thioxanthone is applied, by the casting method, to a polyester film and dried. The photo-sensitive film thus formed has an average layer thickness of 1 to 3 $\mu$ and is exposed through a photographic step wedge to a 400 watt high pressure mercury lamp for 15 to 60 seconds. The image is then developed in 1,1,1-trichloroethane. The relief image thus obtained shows all 10 steps.

EXAMPLE XVIII

This example relates to processes for producing relief images, which can be stained, on transparent carriers, which images are produced by photo-crosslinking of the polymers according to the invention and can be fixed, and developed, in pure water.

A thin layer (0.5 to 1.5 $\mu$ thick) of gelatine is applied, by the casting method, to a polyester carrier which can be used for photographic emulsions and is allowed to crosslink by the action of heat. The gelatine layer is then coated with an aqueous solution consisting of 89 parts by weight of water, 10 parts by weight of the polymer of Example No. 61 and one part by weight of the photo-sensitiser of the formula Table V

| Polymer according to Example No. | Dissolved in | Sensitiser | Exposed seconds | Image of the wedges having screen dots | Steps of the continuous wedge shown in the image |
|---|---|---|---|---|---|
| 1 | CHE, 10% | Thioxanthone | 2 | complete | 5 |
| 2 | CHE, 10% | Thioxanthone | ½ | complete | 5 |
| 3 | CHE, 5% | Thioxanthone | 1 | complete | 6 |
| 6 | CHE, 10% | Thioxanthone | 2 | complete | 6 |
| 6 | CHE, 10% | Thioxanthone | 10 | complete | 10 |
| 6 | CHE, 5% | Thioxanthone | 10 | complete | 10 |
| 6 | CHE, 5% | Michler's ketone | 10 | incomplete | 5 |
| 6 | CHE, 5% | Benzophenone | 10 | incomplete | 1 |
| 6 | CHE, 5% | Benzil | 10 | incomplete | 1 |
| 6 | NaHCO₃, 5% |  | 10 | complete | 10 |
| 6 | CHE, 5% | Without sensitiser | 10 | not readily discernible | 0 |
| 7 | CHE, 10% | Thioxanthone | 60 | complete | 5 |
| 9 | CHE, 10% | Thioxanthone | 2 | complete | 5 |
| 10 | CHE, 10% | Thioxanthone | 10 | complete | 10 |
| 11 | CHE, 5% | Thioxanthone | 10 | complete | 9 |
| 13 | CHE, 10% | Thioxanthone | 20 | complete | 10 |
| 18 | CHE, 10% | Thioxanthone | 20 | complete | 6 |
| 19 | CHE, 10% | Thioxanthone | 30 | complete | 7 |
| 20 | CHE, 10% | Thioxanthone | 10 | complete | 10 |
| 29 | Dimethylformamide 5% | Thioxanthone | 60 | complete | 6 |

If the pre-sensitised plate is developed with organic solvents or if, after developing with a base, an acid bath is used, the aluminium plate can be used as a planographic printing plate.

EXAMPLE XVII

The example relates to processes for producing relief images on transparent carriers, which images are produced by photo-crosslinking of the polymers according so that a photo-sensitive layer 0.5 to 3 $\mu$ thick is obtained. The dried film is exposed through a photographic wedge with 10 steps to a 400 watt high pressure mercury lamp for 10 to 30 seconds. The image is then developed in water. The relief image which is thus obtained and which shows all 10 steps of the wedge can be rendered visible using an aqueous solution of a cationic dyestuff.

In the same way it is also possible to produce, and to use, photo-sensitive layers with the polymer of Example No. 62, which is employed as the sodium salt.

EXAMPLE XIX

This example shows the absolute sensitivity of a polymer according to the invention.

Exposure —HBO 200 watt extremely high pressure mercury vapour lamp (OSRAM) with a narrow band filter for 366 nm, intensity $4.10^{-8}$ Einstein. $cm^{-2}$ Coating —whirler-coated, at 3,000 revolutions per minute, onto polyester Polymer — according to Example 2, 10% strength in cyclohexanone Sensitiser — 1% of thioxanthone Layer thickness — 0.8 μ

Developing — immersed briefly in tetrahydrofurane and subsequently treated in 5% strength aqueous sodium bicarbonate solution and then in a solution of a cationic azo dyestuff (Astradiamantgrun, Bayer).

A value of $S=5.10^{-4}$ J.$cm^{-2}$ was determined for the absolute sensitivity S=Energy/$cm^2$ until an optical density was reached. A plot of log E/$cm^2$ as the abscissa against the optical density as the ordinate is a straight line from the pair of co-ordinates −3.7; 0.25 to the pair of co-ordinates −2; 4.5 and between the abscissa values of −2 and 1.5 the value of the ordinate remains constant at 4.5.

What is claimed is:

1. A polyether, which can be crosslinked under the action of electromagnetic waves, having an average molecular weight of 1000 to 1,000,000 as measured by viscometry of a solution of 0.2 gram of polymer in 100 ml of N,N-dimethylformamide, which is characterized by a structural formula comprising chain members of the formula

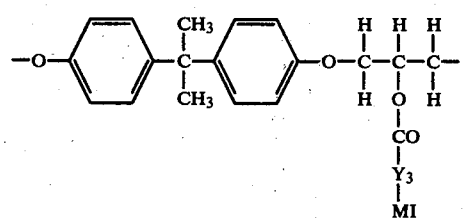

in which MI denotes the maleimido group of formula I

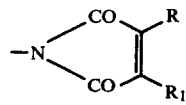

wherein R and $R_1$ independently of one another denote alkyl of 1 to 4 carbon atoms, or R and $R_1$ conjointly denote the remaining part of a five-membered to six-membered carbocyclic ring, $Y_3$ represents an aliphatic, cycloaliphatic, carbocyclicaromatic, araliphatic, heterocyclic-aliphatic or heterocyclic-aromatic radical containing in each case, a total of at most up to 18 carbon atoms or denotes the grouping

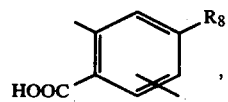

and $R_8$ represents hydrogen, carboxyl or —COO($CH_2$)$_z$$CH_3$ where z is 0 to 18.

2. A polyether according to claim 1 wherein the maleimido group MI is

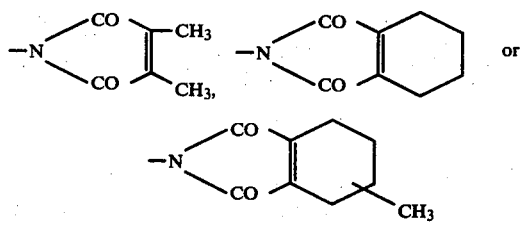

3. A polyether according to claim 2 wherein the maleimido group MI is

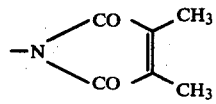

4. A polyether according to claim 1 wherein $Y_3$ is a carbocyclic-aromatic radical.

5. A polyether according to claim 4 wherein $Y_3$ is carboxyphenylene.

6. A polyether according to claim 1 wherein $R_8$ is hydrogen.